US012767836B2

(12) United States Patent
Vasileiou et al.

(10) Patent No.: US 12,767,836 B2
(45) Date of Patent: Oct. 20, 2026

(54) THERMALLY PROCESSIBLE PIEZOELECTRIC COMPOSITIONS CONTAINING A THERMAL CROSSLINKING AGENT AND METHODS ASSOCIATED THEREWITH

(71) Applicant: GENESEE VALLEY INNOVATIONS, LLC, Santa Clara, CA (US)

(72) Inventors: Alexandros Vasileiou, Toronto (CA); Sarah J. Vella, Milton (CA); Edward G. Zwartz, Mississauga (CA)

(73) Assignee: GENESEE VALLEY INNOVATIONS, LLC, Santa Clara, CA (US)

( * ) Notice: Subject to any disclaimer, the term of this patent is extended or adjusted under 35 U.S.C. 154(b) by 565 days.

(21) Appl. No.: 18/479,184

(22) Filed: Oct. 2, 2023

(65) Prior Publication Data

US 2025/0109305 A1 Apr. 3, 2025

(51) Int. Cl.
*C09D 5/24* (2006.01)
*B33Y 10/00* (2015.01)
(Continued)

(52) U.S. Cl.
CPC ................ *C09D 5/24* (2013.01); *B33Y 10/00* (2014.12); *B33Y 70/00* (2014.12); *C09D 7/62* (2018.01);
(Continued)

(58) Field of Classification Search
CPC ... C09D 5/24; C09D 7/63; C09D 7/62; C09D 177/02; B33Y 10/00; B33Y 70/00; H10N 30/045; H10N 30/092; H10N 30/852
(Continued)

(56) References Cited

U.S. PATENT DOCUMENTS 8,772,418 B2 7/2014 Rome et al.
2022/0305719 A1* 9/2022 Vella ...................... B29C 48/05

FOREIGN PATENT DOCUMENTS

CN 103915561 A 7/2014

OTHER PUBLICATIONS

"Nexam Chemical-Genius Applications of the 148 year old Berthelot Reaction," posted Sep. 28, 2014, 13 pp.

(Continued)

*Primary Examiner* — Anita Nassiri-Motlagh
(74) *Attorney, Agent, or Firm* — Vorys, Sater, Seymour and Pease LLP

(57) ABSTRACT

Parts having piezoelectric properties may be formed using compositions comprising a plurality of piezoelectric particles dispersed in at least a portion of a polymer material comprising at least one thermoplastic polymer, and at least one thermal crosslinking agent dispersed in at least a portion of the polymer material. The composition is formable at a melt processing temperature that is at or above a melting point or softening temperature of the at least one thermoplastic polymer for a melt processing time that retains at least a majority of the at least one thermal crosslinking agent in a non-crosslinked state. The at least one thermal crosslinking agent may be present in the polymer material a) covalently bonded to at least a portion of the polymer material, b) covalently bonded to at least a portion of the piezoelectric particles, or c) any combination thereof.

20 Claims, 2 Drawing Sheets

(51) Int. Cl.

| | |
|---|---|
| ***B33Y 70/00*** | (2020.01) |
| ***C08K 3/22*** | (2006.01) |
| ***C08K 5/1539*** | (2006.01) |
| ***C08K 5/3417*** | (2006.01) |
| ***C08K 9/04*** | (2006.01) |
| ***C09D 7/62*** | (2018.01) |
| ***C09D 7/63*** | (2018.01) |
| ***C09D 177/02*** | (2006.01) |
| ***H10N 30/045*** | (2023.01) |
| ***H10N 30/092*** | (2023.01) |
| ***H10N 30/85*** | (2023.01) |

(52) U.S. Cl.
CPC ............. *C09D 7/63* (2018.01); *C09D 177/02* (2013.01); *H10N 30/045* (2023.02); *H10N 30/092* (2023.02); *H10N 30/852* (2023.02); *C08K 2003/2244* (2013.01); *C08K 5/1539* (2013.01); *C08K 5/3417* (2013.01); *C08K 9/04* (2013.01); *C08K 2201/001* (2013.01)

(58) Field of Classification Search
USPC .................................................... 252/62.9 PZ
See application file for complete search history.

(56) References Cited

OTHER PUBLICATIONS

Jia, N., et al., "Effects of Moisture Conditioning Methods on Mechanical Properties of Injection Molded Nylon 6," Journal of Reinforced Plastics and Composites, 2004, pp. 729-737, 23.

Tillet, G., et al., "Chemical reactions of polymer crosslinking and post-crosslinking at room and medium temperature," Prog. Polym. Sci., 2011, pp. 191-217, 36.

* cited by examiner

THERMALLY PROCESSIBLE PIEZOELECTRIC COMPOSITIONS CONTAINING A THERMAL CROSSLINKING AGENT AND METHODS ASSOCIATED THEREWITH

FIELD

The present disclosure generally relates to additive manufacturing and other part-formation processes and, more particularly, thermally processible compositions suitable for additive manufacturing and other part-formation processes to produce parts exhibiting piezoelectric properties.

BACKGROUND

Additive manufacturing, also known as three-dimensional (3D) printing, is a rapidly growing technology area. Although additive manufacturing has traditionally been used for rapid prototyping activities, this technique is being increasingly employed for producing commercial and industrial parts in any number of complex shapes. Additive manufacturing processes typically operate by building an object (part) layer-by-layer, for example, by 1) depositing a stream of molten printing material obtained from a continuous filament or other printing material source, 2) sintering powder particulates of a printing material using a laser, or 3) direct writing using an extrudable paste composition. The layer-by-layer deposition usually takes place under control of a computer to deposit the printing material in precise locations based upon a digital three-dimensional "blueprint" of the part to be manufactured, with consolidation of the printing material often taking place in conjunction with deposition to form the printed part. The printing material forming the body of a printed part may be referred to as a "build material" herein.

Additive manufacturing processes employing a stream of molten printing material for part formation may utilize a thermoplastic polymer filament as a source of the molten printing material. Such additive manufacturing processes are sometimes referred to as "fused deposition modeling" or "fused filament fabrication" processes. The latter term is used herein. Additive manufacturing processes employing thermoplastic polymer pellets or other polymer forms as a source of printing material are also known. Extrudable paste compositions comprising thermoplastic polymers or curable polymer precursors (resins) may also be utilized in similar direct writing additive manufacturing processes.

Additive manufacturing processes employing powder particulates of a printing material oftentimes perform directed heating in selected locations of a particulate bed (powder bed) following printing material deposition to promote coalescence of the powder particulates into a consolidated part. Techniques suitable for promoting consolidation of powder particulates to form a consolidated part include, for example, Powder Bed Fusion (PBF), selective laser sintering (SLS), Electron Beam Melting (EBM), Binder Jetting and Multi-Jet Fusion (MJF).

A wide range of parts having various shapes may be fabricated using the foregoing additive manufacturing processes. In many instances, build materials employed in such additive manufacturing processes may be largely structural in nature, rather than the polymer having an innate functionality itself. One exception is piezoelectric functionality, which may be exhibited in printed parts formed from polyvinylidene fluoride, a polymer which possesses innate piezoelectric properties upon poling. Piezoelectric materials generate charge under mechanical strain or, conversely, undergo mechanical strain when a potential is applied thereto. Potential applications for piezoelectric materials include, for example, sensing, switching, actuation, and energy harvesting.

Despite the desirability of forming printed parts having piezoelectric properties, there are only limited options for doing so at present. Other than polyvinylidene fluoride, the range of piezoelectric polymers is rather limited, and some alternative polymers are not suitable for being printed in additive manufacturing processes employing extrusion. For example, crosslinked polymers are completely unworkable once they have been crosslinked, and polymer resins suitable for forming crosslinked polymers may not by themselves afford form factors suitable for being printed in fused filament fabrication and similar printing processes and/or printed parts formed from polymer resins may not be self-supporting before crosslinking takes place. Moreover, the piezoelectricity of polyvinylidene fluoride is rather low compared to other types of piezoelectric materials. These shortcomings may limit the range of printed parts having a piezoelectric response that may be obtained through present additive manufacturing processes.

Numerous ceramic materials having high piezoelectricity are available, such as lead zirconate titanate (PZT), but they are not printable by themselves and are often very brittle. Moreover, high sintering temperatures (>300° C.) may be needed to promote part consolidation and piezoelectric particle interconnectivity after depositing predominantly a piezoelectric ceramic. Admixtures of polymers and piezoelectric particles have not yet afforded high piezoelectric performance in printed parts. Poor dispersion of the piezoelectric particles in the polymer, particle agglomeration, and limited interactions between the piezoelectric particles and the polymer are to blame in many instances. Without being bound by any theory, the limited interactions between the piezoelectric particles and the polymer result in poor load transfer to the piezoelectric particles, thereby lowering the piezoelectric response obtained therefrom when mechanical strain is applied. Particle agglomeration may also play a role in this regard.

SUMMARY

In some embodiments, the present disclosure provides compositions comprising: a plurality of piezoelectric particles dispersed in at least a portion of a polymer material comprising at least one thermoplastic polymer; and at least one thermal crosslinking agent dispersed in at least a portion of the polymer material. The composition is melt processible at a melt processing temperature that is at or above a melting point or softening temperature of the at least one thermoplastic polymer for a melt processing time that retains at least a majority of the at least one thermal crosslinking in a non-crosslinked state.

In some or other embodiments, the present disclosure provides additive manufacturing processes comprising: providing a composition comprising a plurality of piezoelectric particles dispersed in at least a portion of a polymer material comprising at least one thermoplastic polymer, and at least one thermal crosslinking agent dispersed in at least a portion of the polymer material; depositing the composition layer-by-layer to form a printed part; and after depositing the composition layer-by-layer, heating the composition at a curing temperature that is at or above a minimum crosslinking temperature of the at least one thermal crosslinking agent for a time sufficient to crosslink or increase an extent of crosslinking of the at least one thermal crosslinking agent to form an at least partially cured printed part. Before depositing, the composition is melt processible at a melt processing temperature that is at or above a melting point or softening temperature of the at least one thermoplastic polymer for a melt processing time that retains at least a majority of the at least one thermal crosslinking in a non-crosslinked state.

In still other embodiments, the present disclosure provides printed parts comprising: a composition comprising a plurality of piezoelectric particles dispersed in at least a portion of a polymer material comprising at least one thermoplastic polymer, and at least one thermal crosslinking agent dispersed in at least a portion of the polymer material. Before printing, the composition is melt processible at a melt processing temperature that is at or above a melting point or softening temperature of the at least one thermoplastic polymer for a melt processing time that retains at least a majority of the at least one thermal crosslinking in a non-crosslinked state. The composition is printed at or above the melting point or softening temperature of the at least one thermoplastic polymer.

In yet still other embodiments, the present disclosure provides printed parts comprising: a plurality of piezoelectric particles dispersed in at least a portion of a polymer material comprising at least one thermoplastic polymer, and at least one thermal crosslinking agent dispersed in a crosslinked state in at least a portion of the polymer material. The at least one thermal crosslinking agent comprises a first thermal crosslinker comprising at least one arylacetylene having a reactive functional group, and a second thermal crosslinker comprising a diarylacetylene. The reactive functional group is reactive with a complementary functional group upon the piezoelectric particles, the polymer material, or any combination thereof.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

DETAILED DESCRIPTION

Figure 1:
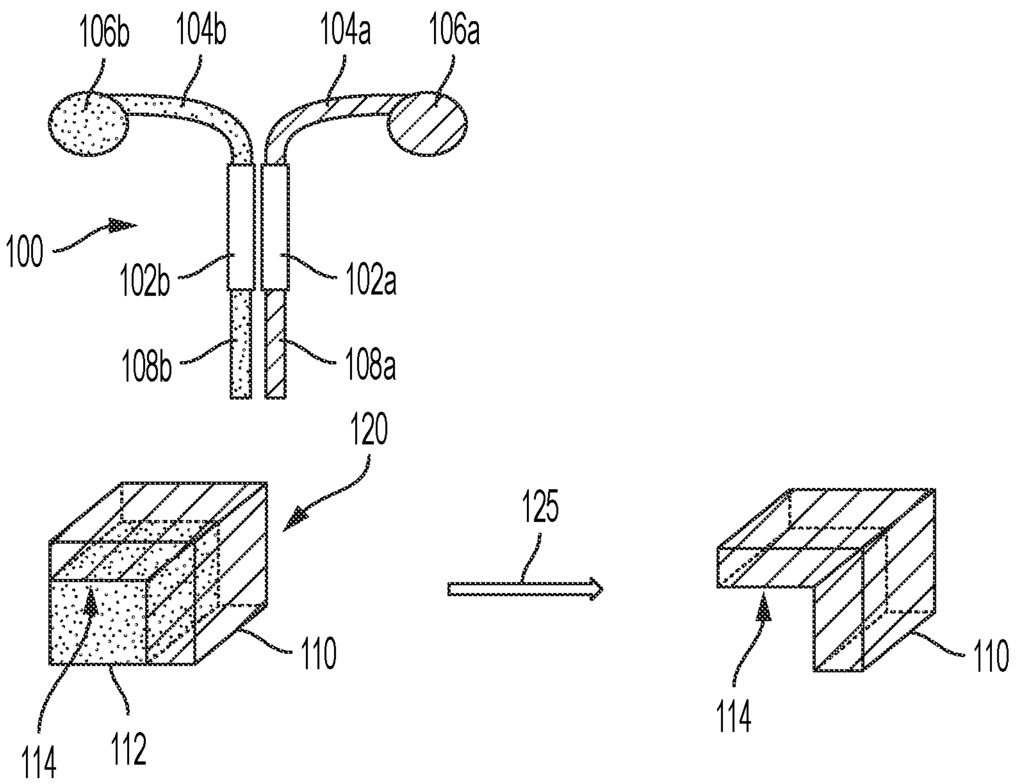
FIG. 1 is a schematic of an illustrative fused filament fabrication process for producing a part using a build material and a removable support material.

The present disclosure generally relates to additive manufacturing and other part-formation processes and, more particularly, thermally processible compositions suitable for additive manufacturing and other part-formation processes to produce parts exhibiting piezoelectric properties.

More specifically, the present disclosure provides compositions in which piezoelectric particles are combined with a polymer material to define a form factor suitable for use in additive manufacturing, or in other part-formation processes requiring processing of the polymer material in a molten, semi-molten, or softened state. The compositions include piezoelectric particles dispersed in at least a portion of a polymer material comprising at least one thermoplastic polymer. The compositions also include at least one thermal crosslinking agent dispersed in at least a portion of the polymer material. The at least one thermal crosslinking agent may be present a) covalently bonded to at least a portion of the polymer material, b) covalently bonded to at least a portion of the piezoelectric particles, or c) any combination thereof. Optionally, at least a portion of the at least one thermal crosslinking agent may not be covalently bonded to either the piezoelectric particles or the polymer material. The compositions may remain melt processible at a melt processing temperature that is at or above a melting point or softening temperature of the at least one thermoplastic polymer for a melt processing time that retains at least a majority of the at least one thermal crosslinking in a non-crosslinked state. As such, the at least one thermal crosslinking agent allows latent crosslinking to take place once the compositions are further processed (e.g., following part formation) at a suitable temperature and for a suitable amount of time for a sufficient degree of crosslinking to take place to realize the benefits discussed herein. The latent crosslinking may crosslink or increase an extent of crosslinking present within the compositions. Notably, the compositions may be formulated under melt blending or similar conditions that do not result in crosslinking taking place, or the extent of crosslinking is exceedingly minor and insignificantly alters the properties of the compositions. As such, the compositions may remain formable, such as through extrusion, and retain at least a majority of the at least one thermal crosslinking agent in a non-crosslinked state. One or more components of the at least one thermal crosslinking agent may contain a reactive functional group for reacting with a complementary functional group upon the polymer material and/or the piezoelectric particles to covalently bond the component thereto. Covalent bonding of the component to the polymer material and/or the piezoelectric particles may take place when formulating the compositions by melt processing and/or under additive manufacturing conditions, but without the at least one thermal crosslinking agent assuming a crosslinked state. Beyond the reactive functional group, the at least one thermal crosslinking agent may contain additional functionality that allows thermal crosslinking to take place under suitable thermal conditions at a desired time. When in the non-crosslinked state, the at least one thermal crosslinking agent does not bridge between two or more piezoelectric particles and/or polymer chains. When covalently bonded to a single piezoelectric particle or polymer chain, but not other piezoelectric particles, polymer chains, or other thermal crosslinking agents, the at least one thermal crosslinking agent is considered to remain non-crosslinked in the disclosure herein.

The compositions are suitable for additive manufacturing by virtue of maintaining extrudability with at least a majority, and preferably higher amounts, of the at least one thermal crosslinking agent in the non-crosslinked state. For alternative part-formation processes, the compositions may similarly remain moldable or formable (e.g., by injection molding or thermoforming) without achieving excessive crosslinking of the at least one thermal crosslinking agent to preclude part formation from taking place. Following part formation, the at least one thermal crosslinking agent may be cured above a minimum crosslinking temperature to promote crosslinking or an increased extent of crosslinking of the at least one thermal crosslinking agent to afford enhanced mechanical properties and other benefits, as discussed further herein. Crosslinking may result in the at least one thermal crosslinking agent assuming a crosslinked state that bridges the thermoplastic polymer, the piezoelectric particles, or any combination thereof. Additional details regarding the thermal crosslinking process are provided below. Following crosslinking, the compositions may experience an enhancement in their piezoelectric properties. Form factors for the compositions with the at least one thermal crosslinking agent in the non-crosslinked state may include, but are not limited to, composite filaments, composite pellets, composite powders, and composite pastes. Such form factors may be usable in and facilitate various additive manufacturing processes and other types of part-formation processes.

Additive manufacturing processes, such as fused filament fabrication, direct writing, or similar layer-by-layer deposition processes, are powerful tools for generating printed parts in a wide range of complex shapes. In many instances, the polymer materials used in layer-by-layer additive manufacturing processes are largely structural in nature and do not convey functional properties to a printed part by themselves. Polyvinylidene fluoride is a notable exception, which may form printed parts having piezoelectricity after suitable poling. Beyond polyvinylidene fluoride, there are few alternative polymer materials for introducing piezoelectricity to a printed part. Furthermore, the piezoelectricity of polyvinylidene fluoride may not be sufficiently large for some intended applications. Ceramic piezoelectric materials are not suitable by themselves for being directly printed in additive manufacturing processes.

In response to the foregoing shortcomings, the present disclosure provides compositions that are composites capable of undergoing extrusion to form printed parts through layer-by-layer additive manufacturing or other types of part-formation processes. Extrusion of the composites may be aided by heating in some cases, such as heating the composites above a melting point or softening temperature of at least one thermoplastic polymer therein, such as during a fused filament fabrication process. Following additive manufacturing or an alternative part-formation process, the compositions may be further cured to promote crosslinking or an increased extent of crosslinking of the at least one thermal crosslinking agent dispersed in at least a portion of the polymer material. That is, the compositions may maintain extrudability during additive manufacturing or an alternative part-formation process and then undergo crosslinking thereafter to complete or enhance the part. To accomplish the thermal crosslinking, the at least one thermal crosslinking agent may be crosslinked above a minimum crosslinking temperature, which may be a higher temperature than that utilized during the additive manufacturing process, and/or heating may take place for a longer period of time than is used during the additive manufacturing process. In either case, substantially no crosslinking or an insignificant increase in crosslinking takes place during the additive manufacturing process itself as a consequence of slow crosslinking kinetics. Crosslinking of the at least one thermal crosslinking agent between piezoelectric particles, between the thermoplastic polymer, and/or between piezoelectric particles and the thermoplastic polymer may improve compatibility between the piezoelectric particles and the polymer material and increase the piezoelectric response. Improved mechanical properties may also be realized following curing. The composites may have more robust mechanical properties than do piezoelectric particles alone, at the least being less brittle and more flexible, and may be formed more readily into printed parts than can the piezoelectric particles alone. Without being bound by any theory or mechanism, crosslinking is believed to enhance the piezoelectric effect (piezoelectricity) by promoting load transfer from the polymer material to the piezoelectric particles. Since crosslinking (or at least a majority of the crosslinking) does not take place until after additive manufacturing has taken place, the compositions may remain readily extrudable for processing into a printed part or filaments used for making a printed part.

Piezoelectric composites comprising polyamides and piezoelectric particles are promising materials for a variety of applications. However, these types of composites are hygroscopic, and their piezoelectric properties may degrade over time, sometimes rapidly, upon exposure to water or atmospheric moisture. Water absorption may lower the glass transition temperature ($T_g$) of the polymer matrix in the piezoelectric composite, thereby allowing polymer chains to move past each other and increase the volume in between as the polymer becomes more pliable. Movement of the polymer chains in this fashion may result in the poles of the piezoelectric particles becoming misaligned, including randomly oriented, thus degrading or even eliminating the piezoelectric response.

The compositions of the present disclosure at least partially resolve the foregoing issues and provide related advantages as well. The compositions of the present disclosure include piezoelectric particles, a polymer material comprising at least one thermoplastic polymer, and at least one thermal crosslinking agent. At least a majority (>50%) of the at least one thermal crosslinking agent remains in a non-crosslinked state in the compositions before curing takes place. The piezoelectric particles and the at least one thermal crosslinking agent are dispersed in at least a portion of the polymer material. Prior to curing, the at least one thermal crosslinking agent in the non-crosslinked state may be present a) covalently bonded to at least a portion of the polymer material, b) covalently bonded to at least a portion of the piezoelectric particles, or c) any combination thereof. Optionally, at least a portion of the at least one thermal crosslinking agent may not be covalently bonded to the polymer material and/or the piezoelectric particles (i.e., remain in an unbound form). By maintaining at least a majority and preferably higher amounts of the at least one thermal crosslinking agent in a non-crosslinked state prior to and during part formation, the compositions may remain thermally extrudable to facilitate additive manufacturing processes (alternately thermally moldable and/or formable to facilitate alternative part-formation processes). Following curing, printed parts formed from the compositions may exhibit increased water resistance, which may inhibit movement of the polymer chains and concurrent degradation of the piezoelectric properties particles.

In addition to the polymer material, the piezoelectric particles may participate in the crosslinking process as well. The piezoelectric particles may bear native functionality that is a complementary functional group for reacting with a reactive functional group of the at least one thermal crosslinking agent and/or the piezoelectric particles may be functionalized with complementary functional groups that can react or bond with a reactive functional group upon the at least one thermal crosslinking agent. Thus, the polymer chains may not only connect to each other via the at least one thermal crosslinking agent, but also to the piezoelectric particles through the at least one thermal crosslinking agent following crosslinking. Further, the piezoelectric particles may connect to each other through the at least one thermal crosslinking agent in a similar manner. These various connections may create a three-dimensional (3D) network following curing, which may inhibit water absorption and/or stabilize the piezoelectric particles within the polymer matrix. By stabilizing the piezoelectric particles, dipoles may be discouraged from becoming misaligned and degrading piezoelectric performance.

The at least one thermal crosslinking agent may have sufficiently slow crosslinking kinetics to facilitate latent crosslinking following formation of a part, such that the compositions may be formed and subsequently deposited under melt processing conditions without significant crosslinking taking place. Because of the slow crosslinking kinetics, the minimum crosslinking temperature may be above or below the melting point or softening temperature of the at least one thermoplastic polymer. That is, the slow crosslinking kinetics may allow heating above the minimum crosslinking temperature for short times to facilitate melt processing but with no or insubstantial crosslinking taking place. By performing curing after an additive manufacturing process, processing and extrudability issues that might otherwise result from earlier crosslinking may be averted. Moreover, such latent (delayed) crosslinking may allow compositions having a range of form factors to be utilized for conducting a given additive manufacturing process (or alternative part-formation process) while still maintaining a high loading of piezoelectric particles. Suitable form factors are provided below. Following crosslinking, printed parts formed from the compositions may exhibit robust mechanical properties. In various embodiments, the compositions may be cured using thermal crosslinking agents that may be crosslinked without a catalyst and/or do not generate any or only an insignificant amount of volatile emissions. By minimizing volatile emissions, cured parts may be substantially void-free while still maintaining a highly crosslinked 3D network. The thermal crosslinking agents may be effective to promote crosslinking of fully formed polymers, such as polyamides, rather than promoting crosslinking of lower molecular weight oligomers that might result in a form factor unsuitable for being produced as a composite filament or other form factor requiring a rather high degree of mechanical integrity. It is to be appreciated, however, that lower molecular weight oligomers may optionally be included in compositions of the present disclosure that comprise fully formed thermoplastic polymers and at least one thermal crosslinking agent, wherein the presence of the oligomers does not impact the ability of the compositions to be deposited or processed in a desired manner, such as during an additive manufacturing, thermoforming, or injection molding process taking place above a melt processing temperature.

Advantageously, the compositions of the present disclosure may exhibit the ability to form self-standing three-dimensional structures once extruded during an additive manufacturing process. The term “self-standing” means that a printed part holds its shape and/or exhibits a yield stress once the composition has been extruded into a desired shape. In contrast, compositions that do not hold their shape following extrusion are referred to as “conformal,” since they may assume the profile of the surface upon which they are deposited. In many instances, the ability for a composition to be extruded and the ability for the composition to provide a self-standing structure following extrusion are mutually exclusive features. For example, a composition that is extrudable may lack sufficient mechanical strength to support itself upon being deposited in a desired shape, and a composite that holds its shape within a three-dimensional structure may be too rigid to be extruded. The compositions of the present disclosure balance these properties. The compositions described herein may further be processed into various form factors capable of undergoing continuous extrusion. Thin films, monolithic layers, and similar quasi-2D structures are not considered to be self-standing shapes in the disclosure herein, since a substrate upon which these types of printed parts are formed may bear the load to retain the part’s shape rather than the part itself being self-standing. It is to be appreciated, however, that the compositions described herein may be utilized to thin films and monolithic layers at the discretion of a user conducting a particular printing application.

Suitable form factors of the composites that may be processed by extrusion, thermoforming, or molding in the disclosure herein include composite filaments, composite pellets, composite powders, composite pastes, or any combination thereof. Additional details regarding these various form factors follows herein. Through choice of the components of the polymer material present therein, particularly at least one thermoplastic polymer, the compositions may remain thermally extrudable, formable, or moldable once a composite with piezoelectric particles has been formed, thereby allowing printed parts to be formed directly through extrusion and/or molding and solidification of the at least one thermoplastic polymer.

Before addressing various aspects of the present disclosure in further detail, a brief discussion of additive manufacturing processes, particularly fused filament fabrication processes, will first be provided so that the features of the present disclosure can be better understood. FIG. 1 is a schematic of an illustrative fused filament fabrication process for producing a part using a build material and a removable support material. As shown in FIG. 1, print head 100 includes first extruder **102*a* and second extruder 102*b*, which are each configured to receive a filamentous printing material. Specifically, first extruder 102*a* is configured to receive first filament 104*a* from first payout reel 106*a* and provide molten stream 108*a* of a first printing material, and second extruder 102*b* is configured to receive second filament 104*b* from second payout reel 106*b* and provide molten stream 108*b* of a second printing material. Both molten streams are initially deposited upon a print bed (not shown in FIG. 1) to promote layer-by-layer growth of supported part 120. The first printing material (build material) supplied by first extruder 102*a* may be a piezoelectric composite of the present disclosure used to fabricate part 110, and the second printing material (removable support material) supplied by second extruder 102*b* may be a dissolvable or degradable polymer, which is used to fabricate removable support 112 under overhang 114. Overhang 114 is not in direct contact with the print bed or a lower printed layer formed from the build material. Overhang 114 need not necessarily be present in a given printed part. In the part arrangement shown in FIG. 1, removable support 112 is interposed between overhang 114 and the print bed, but it is to be appreciated that in alternatively configured parts, removable support 112 may be interposed between two or more portions of part 110**.

Once printing of part 110 and removable support 112 is complete, supported part 120 may be subjected to support removal conditions 125 that result in elimination of removable support 112 (e.g., dissolution or disintegration conditions, or the like) and leave part 110 with overhang 114 unsupported thereon. Support removal conditions 125 may include contact of supported part 120 with a solvent in which removable support 112 is dissolvable or degradable and part 110 is not.

As used herein, the term “piezoelectric particles” refers to particulates having a particle size of about 200 microns or less, wherein the particulates need not necessarily be uniform in shape, exhibit a uniform shape, and/or have substantially the same size.

As used herein, the term "thermal crosslinking agent" refers to a substance that promotes bridging between polymer chains, piezoelectric particles, or any combination thereof once heated above a temperature sufficient for a crosslinking reaction to occur and for a sufficient length of time. In the disclosure herein, the term "minimum crosslinking temperature" refers to the lowest temperature at which thermal crosslinking takes place for a given thermal crosslinking agent. Below the minimum crosslinking temperature, no crosslinking takes place, no matter how long heating is applied to the thermal crosslinking agent. At or above the minimum crosslinking temperature, crosslinking may take place if the thermal crosslinking agent is heated for a sufficient amount of time. The higher the temperature above the minimum crosslinking temperature, the higher the rate of thermal crosslinking and the shorter the sufficient amount of time becomes for a given amount of crosslinking to take place. Accordingly, when crosslinking a thermal crosslinking agent, both heating above the minimum crosslinking temperature and heating for a sufficient amount of time for crosslinking to take place are needed to promote curing or crosslinking of a given system.

Depending on the separation between the minimum crosslinking temperature and the melting point or softening temperature of the at least one thermoplastic polymer, the minimum crosslinking temperature may be above or below the melting point or softening temperature of the at least one thermoplastic polymer. If the minimum crosslinking temperature is above the melting point or softening temperature of the at least one thermoplastic polymer, melt processing may take place without the risk of crosslinking taking place while forming a part. Surprisingly, parts formed from the compositions of the present disclosure may be heated above the melting point or softening temperature in order to promote curing thereof, even when the minimum crosslinking temperature is above the melting point or softening temperature. The high loading of piezoelectric particles is believed to stabilize the compositions and prevent part deformation from taking place due to melting. Alternately, if the minimum crosslinking temperature is below the melting point or softening temperature of the at least one thermoplastic polymer, the crosslinking kinetics are sufficiently slow to allow the compositions to be obtained under melt processing conditions at a melt processing temperature at or above a melting point or softening temperature of the at least one thermoplastic polymer, provided that the melt processing time is sufficiently short to retain at least a majority, and preferably a higher amount of, the at least one thermal crosslinking agent in a non-crosslinked state.

As used herein, the term "non-crosslinked state" refers to a molecule of a thermal crosslinking agent being present in an unbound form that is not covalently bonded to a piezoelectric particle or a polymer chain, is covalently bonded to only one piezoelectric particle, or is covalently bonded to only a single polymer chain. In a non-crosslinked state, a molecule of a thermal crosslinking agent is also not bonded to another molecule of the thermal crosslinking agent. In a "crosslinked state," in contrast, a thermal crosslinking agent forms bridges between piezoelectric particles, polymer chains, and/or other thermal crosslinking agent molecules.

As used herein, the term "unbound form" refers to a molecule of a thermal crosslinking agent that is not covalently bonded to a polymer material, piezoelectric particles, or to other molecules of the thermal crosslinking agent.

As used herein, the terms "non-crosslinked state," "not substantially crosslinked" or "substantially non-crosslinked" refer to no crosslinking promoted by a thermal crosslinking agent or a limited amount of crosslinking promoted by a thermal crosslinking agent, wherein the limited amount of crosslinking insignificantly alters the properties of the compositions and still permits compositions containing the thermal crosslinking agent to be manipulated under melt processing conditions, such as by extrusion, forming, or molding. The limited amount of crosslinking that may be tolerable may depend upon the particular formulation of the composition containing the thermal crosslinking agent. In non-limiting examples, at least a majority (i.e., about 50% or more) of the at least one thermal crosslinking agent may remain in a non-crosslinked state in the compositions disclosed herein. In more particular examples, about 60% or more of the at least one thermal crosslinking agent may remain non-crosslinked, or about 70% or more of the at least one thermal crosslinking agent may remain non-crosslinked, or about 80% or more of the at least one thermal crosslinking agent may remain non-crosslinked, or about 90% or more of the at least one thermal crosslinking agent may remain non-crosslinked, or about 95% or more of the at least one thermal crosslinking agent may remain non-crosslinked, or about 98% or more of the at least one thermal crosslinking agent may remain non-crosslinked or more of the at least one thermal crosslinking agent may remain non-crosslinked. The kinetic profile of the at least one thermal crosslinking agent may be selected to allow formulation of the compositions to take place without crosslinking or with only a limited amount of crosslinking. For example, the crosslinking kinetics may be sufficiently slow to allow formulation of the compositions by melt processing above the minimum crosslinking temperature, wherein the melt processing temperature would be sufficient to promote thermal crosslinking if conducted for a significantly longer time than performed in a short-duration melt processing operation.

As used herein, the "extent of crosslinking" refers to the amount of thermal crosslinking agent that has undergone crosslinking relative to an amount of non-crosslinked thermal crosslinking agent originally present. The extent of crosslinking may be measured indirectly by measurement of mechanical properties, such as Young's Modulus. Alternately, the extent of crosslinking may be measured spectroscopically by FTIR or NMR. In the case of an arylacetylene crosslinking system, the spectroscopic ratio of alkyne signals to aromatic signals may be used to establish the extent of crosslinking. In still another example, a putatively crosslinked sample may be chemically processed to remove the thermal crosslinking agent, such as by solvent extraction, and the amount of extracted thermal crosslinking agent may be measured relative to the amount originally present.

As used herein, the term "diarylacetylene" refers to a molecule containing a first acetylene-functionalized aryl group and a second acetylene-functionalized aryl group.

The terms "curing" and "crosslinking" may be used interchangeably herein.

As used herein, the term "melting point" refers to the temperature or temperature range at which a crystalline polymer or crystalline region of a polymer transitions between a solid state and a liquid state. As used herein, the terms "softening point" or "softening temperature" are used interchangeably to refer to the temperature or temperature range at which an amorphous polymer or amorphous region of a polymer transitions from a rigid state into a pliable or "softened" state. Some crystalline polymers may have both a softening temperature and a melting point. Amorphous polymers only exhibit a softening temperature. Heating a polymer above the melting point or softening temperature may allow the polymer to be compounded with other materials. As used herein, the terms “melt processible,” “melt processing,” and related terms refer to the condition of heating a polymer above either the softening temperature or melting point for some period of time (melt processing time). That is, during melt processing in the disclosure herein, a polymer need not necessarily undergo true melting.

The compositions of the present disclosure include a polymer material comprising at least one thermoplastic polymer. The polymer material may include other components, including oligomers, non-thermoplastic polymers, or precursors thereto, provided that such components do not adversely impact melt processing operations, such as extrusion, molding, forming, or curing. In various embodiments, at least a portion of the thermoplastic polymer or the piezoelectric particles may react with a component of the at least one thermal crosslinking agent prior to curing. This feature allows the at least one thermal crosslinking agent to connect thermoplastic polymer chains to other thermoplastic polymer chains and/or to piezoelectric particles. The thermoplastic polymer may have a complementary functional group for bonding with a reactive functional group upon the at least one thermal crosslinking agent. In various embodiments, the complementary functional group upon the thermoplastic polymer may be an amine and the reactive functional group upon the at least one thermal crosslinking agent may comprise a cyclic anhydride. For example, the at least one thermoplastic polymer may include at least one polyamide, which may bear an unbound amine group at the terminus of the polymer chain for bonding to a reactive functional group upon the at least one thermal crosslinking agent. Other types of amine-containing polymers bearing an unbound amine group may also be suitable for use in the disclosure herein.

Illustrative examples of suitable thermoplastic polymers may include those commonly employed in fused filament fabrication, provided that the thermoplastic polymers include a complementary functional group suitable for reacting with a reactive functional group upon the at least one thermal crosslinking agent. Preferably, the complementary functional group upon the thermoplastic polymer may be an amine, and the thermoplastic polymer may be a polyamide. As used herein, the term “polyamide” is inclusive of polyamide copolymers as well. Examples of polyamides (inclusive of polyaminoacids) include, but are not limited to, polycaproamide (nylon 6, polyamide 6, or PA6), polyhexamethylene succinamide (nylon 46, polyamide 46, or PA46), polyhexamethylene adipamide (nylon 66, polyamide 66, or PA66), polypentamethylene adipamide (nylon 56, polyamide 56, or PA56), polyhexamethylene sebacamide (nylon 610, polyamide 610, or PA610), polyundecamide (nylon 11, polyamide 11, or PA11), polydodecamide (nylon 12, polyamide 12, or PA12), and polyhexamethylene terephthalamide (nylon 6T, polyamide 6T, or PA6T), nylon 10.10 (polyamide 10.10 or PA10.10), nylon 10.12 (polyamide 10.12 or PA10.12), nylon 10.14 (polyamide 10.14 or PA10.14), nylon 10.18 (polyamide 10.18 or PA10.18), nylon 6.10 (polyamide 6.10 or PA6.10), nylon 6.18 (polyamide 6.18 or PA6.18), nylon 6.12 (polyamide 6.12 or PA6.12), nylon 6.14 (polyamide 6.14 or PA6.14), semi-aromatic polyamide, and the like, and any combination thereof. Copolyamides may also be used. Examples of copolyamides include, but are not limited to, PA 11/10.10, PA 6/11, PA 6.6/6, PA 11/12, PA 10.10/10.12, PA 10.10/10.14, PA 11/10.36, PA 11/6.36, PA 10.10/10.36, and the like, and any combination thereof. Examples of polyamide elastomers include, but are not limited to, polyesteramide, polyetheresteramide, polycarbonate-esteramide, and polyether-block-amide elastomers. In some examples, ELVAMIDE® 8064 (DuPont, PA6/66/610 copolymer) may be a suitable polyamide due to its ready processability.

Optionally, the compositions may include one or more conductive additives. The conductive additives may improve the poling efficiency. Suitable conductive additives many include metal particles, metal fibers, metal-coated graphite, carbon nanomaterials, or any combination thereof. Non-conductive carbon nanomaterials may similarly be included.

When included, carbon nanomaterials may be dispersed in at least a portion of the at least one thermoplastic polymer. Suitable carbon nanomaterials for use in the disclosure herein may include, for example, exfoliated graphite, exfoliated graphite nanoplatelets, carbon nanofibers (CNF), carbon nanotubes (CNT), graphene, graphene oxides, reduced graphene oxides, graphite oxides, graphene oxide nanosheets, fullerenes, and the like. Conductive carbon fibers may be utilized similarly. In some examples, the carbon nanomaterials may comprise at least one electrically conductive carbon nanomaterial, optionally in combination with one or more carbon nanomaterials that are not electrically conductive. Illustrative examples of carbon nanomaterials that may be present in the compositions disclosed herein include, for example, single-wall carbon nanotubes, multi-wall carbon nanotubes, carbon nanofibers, graphene, reduced graphene oxide, or any combination thereof. The carbon nanomaterials may be dispersed from one another as individual particles in the compositions disclosed herein. Optionally, the carbon nanomaterials (if present) may also be covalently bonded with the at least one thermal crosslinking agent and crosslinked with each other, and/or the polymer material, and/or the piezoelectric particles.

When included, carbon nanomaterials may be present in the compositions at a loading of about 10 vol % or below, or about 6 vol % or below, or about 3 vol %, or below, or about 1 vol % or below, based on total volume of the composition. In illustrative examples, the loading of the carbon nanomaterials may range from about 0.1 vol % to about 5 vol %, or about 5 vol % to about 10 vol %, each based on total volume of the composition. In some examples, the carbon nanomaterial may be graphene nanoplatelets having a thickness of 6-8 nm, a surface area of 120 to 150 $m^2/g$ and a particle size of about 15 μm.

The compositions of the present disclosure include a plurality of piezoelectric particles that are dispersed in at least a portion of the at least one thermoplastic polymer. Suitable piezoelectric particles for use in the present disclosure are not believed to be particularly limited, provided that the piezoelectric particles may be adequately blended with the at least one thermoplastic polymer, preferably remaining as individuals once blending with the at least one thermoplastic polymer has taken place. The piezoelectric particles may be further functionalized to promote a covalent or a desired non-covalent interaction with a specified polymer material and/or a thermal crosslinking agent. Optionally, the piezoelectric particles may additionally be covalently bonded to the at least one thermoplastic polymer to form a covalently crosslinked matrix. Covalent bonding may take place between surface functional groups present upon the piezoelectric particles, such as surface hydroxyl groups, and at least a portion of the at least one thermoplastic polymer, or the surface functional groups may be further functionalized with a moiety bearing a complementary functional group capable of reacting with the at least one thermal crosslinking agent. Various strategies for promoting covalent bond formation may be contemplated by persons having ordinary skill in the art.

Illustrative examples of piezoelectric materials that may be present in piezoelectric particles suitable for use herein include, but are not limited to, crystalline and non-crystalline ceramics, and naturally occurring piezoelectric materials. Suitable crystalline ceramics exhibiting piezoelectric properties may include, but are not limited to, lead zirconate titanate (PZT), potassium niobate, sodium tungstate, $Ba_2NaNNb_5O_5$, and $Pb_2KNb_5O_{15}$. Suitable non-crystalline ceramics exhibiting piezoelectric properties may include, but are not limited to, sodium potassium niobate, bismuth ferrite, sodium niobate, barium titanate, bismuth titanate, and sodium bismuth titanate. Particularly suitable examples of piezoelectric particles for use in the disclosure herein may include those containing, for instance, lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof. Suitable dopants for lead zirconate titanate may include, but are not limited to Ni, Bi, La, and Nd.

Other suitable piezoelectric particles may include naturally occurring piezoelectric materials such as, for example, quartz crystals, cane sugar, Rochelle salt, topaz, tourmaline, bone, or any combination thereof. Still other examples of piezoelectric materials that may be used include, for example, ZnO, $BiFO_3$, and $Bi_4Ti_3O_{12}$.

The piezoelectric particles employed in the disclosure herein may have an average particle size in a micrometer or nanometer size range. In more particular examples, suitable piezoelectric particles may have a diameter of about 100 microns or less, about 50 microns or less, or about 25 microns or less, or about 10 microns or less, such as about 1 micron to about 10 microns, or about 2 microns to about 8 microns, or about 10 microns to about 75 microns, or about 50 microns to about 100 microns. Smaller piezoelectric particles, such as those having an average particle size under 100 nm or an average particle size of about 100 nm to about 500 nm or about 500 nm to about 1 micron may also be utilized in the disclosure herein. Average particle sizes in the disclosure herein represent $D_{50}$ values, which refers to a diameter at which 50% of the sample (on a volume basis unless otherwise specified) is comprised of particles having a diameter less than said diameter. $D_{50}$ may also be referred to as the "average particle size." Such average particle size measurements may be made by analysis of optical images, including via SEM analysis, or using onboard software of a Malvern Mastersizer 3000 Aero S instrument, which uses light scattering techniques for particle size measurement.

The at least one thermoplastic polymer or the piezoelectric particles may constitute a majority component of the compositions disclosed herein. In various embodiments, the piezoelectric particles may comprise at least about 5 vol %, or at least about 10 vol %, or at least about 20 vol %, or at least about 30 vol %, or at least about 40 vol %, or at least about 50 vol %, or at least about 60 vol %, or at least about 70 vol %, or at least about 80 vol %, or at least about 85 vol %, or at least about 90 vol %, or at least about 95 vol % of the compositions based on total volume. In more particular embodiments, the piezoelectric particles may comprise about 5 vol % to about 90 vol %, or about 10 vol % to about 85 vol %, or about 25 vol % to about 75 vol %, or about 40 vol % to about 60 vol %, or about 50 vol % to about 70 vol % of the compositions based on total volume. A minimum volume percentage may be selected such that satisfactory piezoelectric properties are realized. A maximum volume percentage of the piezoelectric particles may be chosen such that the composition maintains structural integrity and extrudability. For example, in the case of composite filaments, the amount of piezoelectric particles may be chosen to maintain structural integrity as a continuous filament and that also remains printable by fused filament fabrication. Preferably, the piezoelectric particles may be distributed within the at least one thermoplastic polymer under conditions at which the piezoelectric particles remain substantially dispersed as individuals without becoming significantly agglomerated with each other.

In various embodiments, the piezoelectric particles may be functionalized with a piezoelectric particle functionalizer to introduce a complementary functional group capable of reacting with a reactive functional group upon the at least one thermal crosslinking agent. In various embodiments, the piezoelectric particle functionalizer may include functional groups such as oxysilanes, thiols, disulfides, or a combination thereof, which may become covalently bonded to the surface of the piezoelectric particles. The piezoelectric particle functionalizer may further have one or more complementary functional groups that may react with a reactive functional group upon the at least one thermal crosslinking agent under appropriate reaction conditions. The complementary functional group that reacts with a reactive functional group upon the at least one thermal crosslinking agent may be an amine or hydroxide, for example.

Illustrative examples of suitable piezoelectric particle functionalizers may include oxysilanes with pendant amines such as 3-aminopropyl triethoxy silane (APTES), 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-aminopropylmethyldiethoxysilane, 3-aminopropyldimethylmethoxysilane, and 3-aminopropyldimethylethoxysilane, thiols with pendant amines such as 2-aminoethanethiol, 2-(butylamino)ethanethiol, disulfides with pendant amines such as thiuram disulfide, and the like.

The piezoelectric particles may be agglomerated prior to being dispersed in the polymer material comprising the at least one thermoplastic polymer. Agglomeration refers to an assembly comprising a plurality of particulates that are loosely held together through physical bonding forces. Agglomerates may be broken apart through input of energy, such as through applying ultrasonic energy, to break the physical bonds. Homogenization may also be used to promote de-agglomeration. Agglomerates may be broken apart through using a high-shear mixer. Individual piezoelectric particles that have been produced through de-agglomeration may remain de-agglomerated once blending with a polymer material has taken place. That is, defined agglomerates are not believed to re-form during the blending processes with a polymer material as disclosed herein. Similarly, the piezoelectric particles may remain de-agglomerated when forming and at least partially curing a printed part. It is to be appreciated that two or more piezoelectric particles may be in contact with one another in a piezoelectric composite or printed part, but the extent of interaction is less than that occurring in an agglomerate of piezoelectric particulates. In non-limiting examples, agglomerates of piezoelectric particles may have a size ranging from about 100 microns to about 200 microns, and individual piezoelectric particles obtained after de-agglomeration may be in a size range smaller than 100 microns, or smaller than 50 microns, or smaller than 10 microns, such as about 1 micron to about 5 microns, or about 1 micron to about 10 microns, or about 10 microns to about 25 microns, or any other size range disclosed above. The de-agglomerated piezoelectric particle sizes may be maintained following formation of a form factor of the present disclosure. Without being bound by theory, the de-agglomeration process of the piezoelectric particles is believed to lead to the excellent dispersion of the piezoelectric particles in the polymer material comprising at least one thermoplastic polymer. Further without being bound by theory, it is believed that once the piezoelectric particles are de-agglomerated with this process, when they are mixed with a polymer material comprising at least one thermoplastic polymer, the piezoelectric particles may remain uniformly dispersed in the polymer material.

Methods for forming compositions of the present disclosure may include de-agglomeration of piezoelectric particles. In particular, piezoelectric particles employed to form the melt blends may be obtained by probe sonication, specifically probe sonication of larger piezoelectric particles or agglomerates thereof, wherein the input of sonic energy promotes de-agglomeration and formation of a reduced particle size. Homogenization or ball milling may similarly promote de-agglomeration. In more specific examples, piezoelectric particles or similar piezoelectric particles processed by probe sonication may have an average particle size of about 100 microns or less, or about 50 microns or less, or about 25 microns or less, or about 10 microns or less, such as a particle size ranging from about 1 micron to about 5 microns, or about 1 micron to about 2 microns, or about 1 micron to about 10 microns, or about 10 microns to about 25 microns. These piezoelectric particle sizes may be maintained in the compositions disclosed herein, with the piezoelectric particles remaining in a substantially non-agglomerated form once blended with a polymer material to define a composite or within a printed part.

The compositions include at least one thermal crosslinking agent. Upon exposure to sufficient heat and for a sufficient length of time, the at least one thermal crosslinking agent may undergo crosslinking, as discussed further below for the case of arylacetylene thermal crosslinking agents. That is, when exposed to a melt processing temperature that is at or above a minimum crosslinking temperature, the melt processing temperature may be maintained for a sufficient time for a desired extent of thermal crosslinking to take place, or the melt processing temperature may be maintained for a time such that no or minimal thermal crosslinking takes place. The thermal crosslinking process may be further aided by at least one reactive functional group within the at least one thermal crosslinking agent, which may undergo a reaction with a specified complementary functional group (e.g., an amine) upon the piezoelectric particles, the thermoplastic polymer, or any combination thereof to promote covalent bonding thereto. Covalent bonding of the reactive functional group to the thermoplastic polymer, the piezoelectric particles, or any combination thereof may allow the thermoplastic polymer and/or the piezoelectric particles to become crosslinked with each other once thermal crosslinking takes place. The reactive functional group may undergo covalent bond formation before thermal crosslinking takes place, or covalent bond formation may take place in conjunction with the thermal crosslinking process itself.

In various embodiments, suitable reactive functional groups in the at least one thermal crosslinking agent may comprise one or more functional groups such as an anhydride (e.g., a cyclic anhydride), an acid chloride, an alkyl halide such as an alkyl bromide or alkyl chloride, a ketone, an aldehyde, or a sulfonyl chloride, any of which may be effective for reacting with an amine in the at least one thermoplastic polymer or the piezoelectric particles. Again, it is to be emphasized that the reactive functional group may promote covalent bond formation to the piezoelectric particles and/or the at least one thermoplastic polymer without crosslinking otherwise taking place.

In non-limiting examples, the at least one thermal crosslinking agent may comprise a first thermal crosslinker comprising an arylacetylene having a reactive functional group. The reactive functional group is reactive with a complementary functional group upon the piezoelectric particles, the at least one thermoplastic polymer, or any combination thereof (e.g., an amine upon the piezoelectric particles and/or the at least one thermoplastic polymer). The carbon-carbon triple bond of the arylacetylene may promote curing by undergoing cyclization (e.g., a 2+2+2 cycloaddition with two additional alkyne groups) to produce a substituted phenyl ring under thermal curing conditions. The substituted phenyl may link two or more thermal crosslinking agents together to achieve a crosslinked network. The substituted phenyl ring may be present within a group crosslinking the thermoplastic polymer, the piezoelectric particles, or any combination thereof. Preferably, the cycloaddition reaction may occur in the presence of one or more additional thermal crosslinking agents, each also comprising at least one alkyne group that may participate in the cycloaddition reaction.

Preferably, the first thermal crosslinker may comprise an arylacetylene that also contains a cyclic anhydride as a reactive functional group. The reactive functional group may promote covalent bonding to a complementary functional group (e.g., an amine) upon the piezoelectric particles, the at least one thermoplastic polymer, or any combination thereof, and the carbon-carbon triple bond of the arylacetylene may separately undergo cycloaddition to facilitate the crosslinking.

The ratio of the first thermal crosslinker to the thermoplastic polymer is not believed to be particularly limited. In non-limiting examples, the first thermal crosslinker may be present in the composition at a range from about 0.1 wt % to about 1 wt %, or about 1 wt % to about 2 wt %, or about 2 wt % to about 3 wt %, or about 0.1 wt % to about 10 wt %, or about 0.1 wt % to about 5 wt %, or about 5 wt % to about 10 wt %, or less than or equal to about 5 wt %, or less than or equal to about 2 wt %, each based on the weight of the at least one thermoplastic polymer.

Optionally but preferably, the at least one thermal crosslinking agent may comprise a second thermal crosslinker comprising a diarylacetylene. Without being bound by theory or mechanism, two separate molecules of diarylacetylene may each provide an arylacetylene moiety having the carbon-carbon triple bond in an arrangement to undergo the 2+2+2 cycloaddition reaction with the first thermal crosslinker, thereby forming a trisubstituted phenyl ring. A second arylacetylene moiety of each second thermal crosslinker may undergo a separate 2+2+2 cycloaddition with other arylacetylene moieties of the first thermal crosslinker to form a crosslinked network. Particularly suitable diarylacetylenes may contain a first arylacetylene moiety joined to a second arylacetylene moiety by a linker group. Suitable linker groups may include an optionally substituted alkylene or oxyalkylene group. In more specific examples, the linker moiety may be an optionally substituted alkylene group, such as a C4-C24 alkylene group, or a C6-C30 alkylene group, or a C6-C18 alkylene group. Without being bound by theory or mechanism, the linker group may provide conformational flexibility to allow the arylacetylene group to participate in the 2+2+2 cycloaddition reaction.

The ratio of the second thermal crosslinker to thermoplastic polymer is also not believed to be particularly limited. The second thermal crosslinker may be present in the compositions at a range from about 0.1 wt % to about 1 wt %, or about 1 wt % to about 2 wt %, or about 2 wt % to about 3 wt %, or about 0.1 wt % to about 10 wt %, or about 10 wt % to about 20 wt %, or about 0.1 wt % to about 5 wt %, or about 5 wt % to about 10 wt %, or about 10 wt % to about 15 wt %, or about 15 wt % to about 20 wt %, or about 10 wt % to about 20 wt %, or less than or equal to about 10 wt %, or less than or equal to about 5 wt %, or less than or equal to about 2 wt %, each based on the weight of the at least one thermoplastic polymer.

Suitable crosslinking agents comprising a first thermal crosslinker that is an arylacetylene having a cyclic anhydride and an optional but preferable second thermal crosslinker that is a diarylacetylene are further described in U.S. Pat. No. 8,772,418, which is incorporated herein by reference.

Additive manufacturing processes of the present disclosure may comprise: providing a composition of the present disclosure having a suitable form factor; depositing the composition layer-by-layer to form a printed part; and after depositing the composition layer-by-layer, heating the composition at a curing temperature that is at or above the minimum crosslinking temperature of the at least one thermal crosslinking agent for a time sufficient to crosslink or increase an extent of crosslinking of the at least one thermal crosslinking agent to form an at least partially cured printed part. After at least partial curing, such printed parts may comprise: a plurality of piezoelectric particles dispersed in at least a portion of a polymer material comprising at least one thermoplastic polymer; and at least one thermal crosslinking agent dispersed in a crosslinked state in at least a portion of the polymer material. The crosslinked state may result in bridging between two or more unbound molecules of the at least one thermal crosslinking agent, between at least a portion of the at least one thermoplastic polymer, between at least a portion of the plurality of piezoelectric particles, or any combination thereof. The at least one thermal crosslinking agent may comprise a first thermal crosslinker comprising an arylacetylene having a reactive functional group and an optional but preferable second thermal crosslinker comprising a diarylacetylene, wherein the reactive functional group is reactive with a complementary functional group upon the piezoelectric particles, the polymer material, or any combination thereof. In preferred examples, the piezoelectric particles and/or the at least one thermoplastic polymer may comprise an amine group, and the reactive functional group may be a cyclic anhydride.

Curing of printed parts containing at least one thermal crosslinking agent may occur at or above a minimum crosslinking temperature of the at least one thermal crosslinking agent, provided that the curing temperature is maintained for a length of time sufficient to achieve a desired extent of crosslinking. The curing temperature may be above or below a melt processing temperature that is employed during formation of the compositions (e.g., by melt blending) and/or that is employed in an additive manufacturing process. In various embodiments, curing may occur at a temperature of about 150° C. or above, or about 200° C. or above, or about 250° C. or above. The curing may occur at a temperature up to that where a printed part begins to deform. This temperature may be up to the melting point or softening temperature of the at least one thermoplastic polymer, or even above the melting point or softening temperature of the at least one thermoplastic polymer in some cases. Curing above the melting point or softening temperature may be facilitated by the piezoelectric particles, which are believed to discourage polymer deformation from taking place above the melting point or softening temperature. In various embodiments, curing may occur at a temperature from about 190° C. to about 200° C., about 200° C. to about 210° C., about 210° C. to about 220° C., about 220° C. to about 240° C., about 240° C. to about 250° C., about 250° C. to about 260° C., about 260° C. to about 270° C., about 270° C. to about 280° C., about 280° C. to about 290° C., about 290° C. to about 300° C., about 300° C. to about 310° C., about 310° C. to about 320° C., about 320° C. to about 330° C., about 330° C. to about 350° C., or about 350° C. to about 400° C. The actual curing temperature may be selected based upon the type of thermal crosslinking agent that is used and the range of curing temperatures that may be tolerated by the at least one thermoplastic polymer.

To promote curing, heating may be conducted for a length of time sufficient to produce a desired extent of crosslinking. In non-limiting examples, heating may take place for a time of at least about 8 h, or at least about 16 h, or at least about 24 h, or at least 36 h, or at least 48 h, or at least about 72 h. It is to be recognized that curing need not necessarily crosslink all of the at least one thermal crosslinking agent. Instead, heating at the selected curing temperature may take place for a time sufficient to measurably change one or more properties of the compositions or to achieve a desired extent of crosslinking relative to the as-obtained compositions.

The compositions of the present disclosure may be formed by melting or softening the polymer material containing the at least one thermoplastic polymer, and blending in the other components to create a mixture. Compounding of the compositions may include melting the polymer material and then introducing the at least one thermal crosslinking agent and the piezoelectric particles to the resulting polymer melt. Preferably, the piezoelectric particles are added last. This allows the piezoelectric particles to remain substantially non-agglomerated as they are added to the polymer material and other components. Mixing may take place in a compounder such as a Haake compounder, Haake compounder with roller rotors, or a Haake Rheomix 600 with roller rotors. Mixing may take place at a temperature from about 100° C. to about 200° C., about 200° C. to about 300° C., about 200° C. to 250° C., or about 230° C. to about 240° C. Blending may take place over a melt processing time and a melt processing temperature range at which substantial crosslinking of the at least one thermal crosslinking agent does not take place, thereby maintaining the composition in a form that may be processed into a part having a desired shape, such as through extrusion, molding, or thermoforming The de-agglomerated piezoelectric particles may be added all at once, continuously, or portion-wise. Continuous or portion-wise addition may avoid dropping the temperature of the mixture too significantly. Following mixing and cooling, the composition may be shredded, cut, pulverized cryo-milled, milled, ground, or the like to afford pellets of a specified size and geometry, or composite powders having even smaller dimensions and a wide distribution of particle sizes.

Suitable form factors of the compositions disclosed herein may include composite filaments, composite pellets, composite powders, composite pastes, or any combination thereof. Additional details regarding these various form factors follows herein.

Composite filaments may range from about 0.5 mm to about 10 mm in diameter, or about 1 mm to about 5 mm in diameter, particularly about 1.5 mm to about 3.5 mm in diameter. Standard filament diameters for many three-dimensional printers employing fused filament fabrication technology are 1.75 mm or 2.85 mm (about 3.0 mm). Accordingly, suitable composite filaments may have a diameter from about 1.4 mm to about 1.5 mm, about 1.5 mm to about 1.6 mm, about 1.6 mm to about 1.7 mm, or about 1.7 mm to about 1.8 mm, from about 1.4 mm to 1.8 mm or from about 1.5 to about 1.6 mm. The diameter of the composite filaments may be measured using an inline thickness gauge. It is to be recognized that any suitable filament diameter may be used in accordance with the disclosure herein, provided that the filament is compatible with a user's particular printing system. Similarly, the length and/or color of the composite filaments is/are not believed to be particularly limited in the printing processes disclosed herein. Preferably, the composite filaments disclosed herein and utilized in processes for forming a printed part are continuous filaments and may be of spoolable length, such as at least about 1 foot, or at least about 5 feet, or at least about 10 feet, or at least about 25 feet, or at least about 50 feet, or at least about 100 feet, or at least about 250 feet, or at least about 500 feet, or at least about 1000 feet. The term "spoolable length" means sufficiently long to be wound on a spool or reel. It is to be appreciated that a composite filament of "spoolable length" need not necessarily be spooled, such as when the composite filament is too rigid to be wound onto a spool.

Accordingly, composite filaments produced according to the disclosure herein may have a diameter and length compatible for use in fused filament fabrication additive manufacturing processes. Particularly suitable examples may include composite filament diameters ranging from about 1 mm to about 10 mm and a length compatible with a continuous printing process. Various filament processing conditions may be utilized to adjust the filament diameter, as explained hereinafter.

Although composite filaments may be an advantageous and particularly versatile form factor, it is to be realized that composite pellets may also be produced through melt blending and used in similar additive manufacturing processes. Namely, a plurality of piezoelectric particles, a polymer material comprising at least one thermoplastic polymer, and at least one thermal crosslinking agent may be combined with one another under melt blending conditions that do not result in substantial crosslinking of the at least one thermal crosslinking agent, and instead of extruding to form composite filaments, larger extrudates may be produced, which may then be cut, shredded, pulverized, or the like to afford composite pellets of a specified size and geometry, or composite powders having even smaller dimensions and a wide distribution of particle sizes. Other than having a different shape, the microscopic morphology of the composite pellets and composite powders may be similar to that of composite filaments. Like composite filaments, composite pellets and composite powders may be subsequently processed into printed parts having piezoelectric properties under suitable additive manufacturing conditions, wherein thermal curing within at least a portion of a printed part may take place following printing.

Instead of being produced in an elongate form similar to composite filaments, composite pellets may be characterized by an aspect ratio of about 5 or less and particle sizes having dimensions ranging from about 100 microns to about 5 cm. Composite pellets may feature a loading of piezoelectric particles in the polymer material similar to that of composite filaments, and once printed and poled, they may provide a similar range of $d_{33}$ values. Similarly, the piezoelectric particles may remain in a substantially non-agglomerated form in the composite pellets produced according to the disclosure herein.

Composite powders may be obtained by grinding, milling, pulverizing, or similar processes to produce non-elongate particulates having an irregular shape and a particle size of about 10 microns to about 1 mm, or about 10 microns to about 500 microns, or about 10 microns to about 100 microns. The particle size distribution may be relatively wide when composite powders are produced by grinding or similar processes, but the particle size distribution may be narrowed by sieving or a similar size sorting technique, if desired.

Another suitable form factor that may be produced in the disclosure herein is an extrudable composite paste. As used herein, the term "paste" refers to a composition that is at least partially fluid at a temperature of interest. The term "paste" does not necessarily imply an adhesive function of any type. Moreover, the terms "paste" and "ink" may be used interchangeably with one another in the disclosure herein with respect to direct writing additive manufacturing processes. Unlike composite filaments and composite pellets discussed in brief above, extrudable composite pastes may comprise at least one solvent to facilitate extrusion. The at least one solvent may or may not dissolve the polymer material or a portion thereof. Optionally, suitable composite pastes may be at least biphasic and contain at least two immiscible fluid phases, wherein the piezoelectric particles and the polymer material are present in one or both of the at least two immiscible fluid phases.

Optionally, the composite pastes may comprise a sol-gel material. When present, the sol-gel material may be included in an amount ranging from about 10 wt % to about 20 wt %, based on a combined mass of the composite paste. Inclusion of a sol-gel may result in a stiff matrix following curing, which may enhance the piezoelectric response obtained from the piezoelectric particles.

Suitable solvents that may be present in the composite pastes may include high-boiling solvents such as, but are not limited to, 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, glycerol, 2-(2-methoxyethoxy) acetic acid or any combination thereof. Other high-boiling solvents having a boiling point in the range of about 100° C. to about 300° C. may be used as well. Suitable amounts of the at least one solvent may range from about 3 wt % to about 35 wt %, based on total mass of the extrudable composite paste.

In some embodiments, the extrudable composite pastes may be biphasic, in which case the at least one solvent may comprise water and a water-immiscible solvent. In non-limiting examples, an aqueous phase may comprise the water, a water-soluble polymer, and an immiscible organic phase may comprise a non-water soluble polymer material and an optional organic solvent. The piezoelectric particles may be present within either the aqueous phase or the organic phase. When used, a sol-gel material may be present in the aqueous phase.

The composite pastes may exhibit shear-thinning behavior, such that they may be readily extruded but quickly assume a fixed shape having a yield stress of about 100 Pa or greater upon being printed. In non-limiting examples, the composite pastes may have a viscosity of about 15,000 cP to about 200,000 cP when being sheared at a rate of about 5-10 $s^{-1}$.

The compositions disclosed herein may be used in additive manufacturing to print or manufacture a printed part, also referred to herein as a "printed object" or a "part." The compositions may be utilized in an additive manufacturing apparatus to perform fused filament fabrication, for example. There are many variations to fused filament fabrication, and such processes are not limited to the description hereinafter. A printed part may be manufactured by fused filament fabrication according to the following: providing a composition of the present disclosure in a composite filament form, for example, on a spool; feeding the filament into an extruder of the additive manufacturing apparatus; heating the composite filament to a specified temperature to create a molten stream of composite; and pushing the composite through a nozzle on the extruder onto a bed to form a part of a desired type. Composite filament is fed out at a certain rate and the extruder is moved around so that a part is printed layer-by-layer. Fused filament fabrication may involve using more than one type of filament and/or more than one extruder. Fused filament fabrication may involve printing a support piece made of a different material than the compositions (build material) of this disclosure. Persons having ordinary skill in the art of fused filament fabrication can adjust the extruder's heat, print parameters, and print bed characteristics to form a printed part using composite filaments of this disclosure.

In various embodiments, the part being formed by additive manufacturing may be subjected to formation conditions that do not exceed certain temperatures. More specifically, the temperature during additive manufacturing may be selected to facilitate extrusion (e.g., above the melting point or softening temperature of the at least one thermoplastic polymer) but below a temperature at which the at least one thermal crosslinking agent becomes active for undergoing crosslinking. Alternately, the temperature may be sufficient to promote thermal crosslinking, but the duration of heating above the minimum crosslinking temperature is sufficiently short to preclude or limit the amount of crosslinking that takes place. Polymer melting points may be determined by ASTM E794-06(2018) with 10° C./min ramping and cooling rates. The softening temperature represents the temperature or temperature range at which a polymer softens and loses rigidity. The softening temperature may be determined via dynamic mechanical analysis, such as ASTM D5026 or by ASTM D6090-17.

In non-limiting examples, the additive manufacturing process may occur at a temperature from about 100° C. to about 110° C., or about 110° C. to about 120° C., or about 120° C. to about 130° C., or about 140° C. to about 150° C., or about 150° C. to about 160° C., or about 160° C. to about 170° C., or about 170° C. to about 180° C., or about 180° C. to about 190° C., or about 190° C. to about 200° C., or about 200° C. to about 210° C., or about 210° C. to about 220° C., or about 220° C. to about 240° C., or about 240° C. to about 250° C., or about 250° C. to about 260° C., or about 260° C. to about 270° C., or about 270° C. to about 280° C., or about 280° C. to about 290° C., or about 290° C. to about 300° C., or about 100° C. to about 150° C., or about 150° C. to about 175° C., or about 150° C. to about 200° C. The minimum curing temperature and the temperature at which curing takes place may be above or below the temperature at which the additive manufacturing process takes place.

Once an additive manufacturing process has taken place to form a printed part, the printed part may be cured to induce crosslinking of the at least one thermal crosslinking agent. As mentioned above, some limited crosslinking may occur during the additive manufacturing process, but more typically a majority of the thermal crosslinking takes place after the additive manufacturing process is complete. To cure a printed part comprising the at least one thermal crosslinking agent, the part is raised to a sufficient temperature at which the at least one thermal crosslinking agent undergoes a crosslinking reaction (i.e., the minimum curing temperature). To subject the part to heat, the part may be placed in an oven or furnace or subjected to another method for heating the part (e.g., heated air). Suitable heating conditions to promote thermal crosslinking are discussed further above.

After a printed part has been formed and optionally but preferably cured, poling may then take place. Poling involves subjecting a material to a very high electric field so that dipoles of a piezoelectric material orient themselves to align in the direction of the applied field. Suitable poling conditions will be familiar to one having ordinary skill in the art. In non-limiting examples, poling may be conducted by corona poling, electrode poling, or any combination thereof. In corona poling, a piezoelectric material is subjected to a corona discharge in which charged ions are generated and collect on a surface. An electric field is generated between the charged ions on the surface of a material and a grounded plane on the other side of the material. The grounded plane may be directly adhered to the material or present as a grounded plate. In electrode poling (contact poling), two electrodes are placed on either side of a piezoelectric material, and the material is subjected to a high electric field generated between the two electrodes.

Although poling may be conducted as a separate step, as described above, poling may also be conducted in concert with an additive manufacturing process. In non-limiting examples, a high voltage may be applied between an extrusion nozzle supplying molten composite (formed from the composite filaments or composite pellets disclosed herein) and a grounded plane onto which the molten composite is being deposited to form a printed part. Optionally, poling may also take place in conjunction with curing of a printed part as well.

The piezoelectric compositions may be capable of forming single-layer thin films. These thin films may be cured using a thermopress, and may be 2×2 cm with thicknesses ranging from about 0.1 mm to about 1.0 mm. The piezoelectric properties of the piezoelectric composition thin films may be evaluated by measuring the $d_{33}$ value using an APC International Wide-Range $d_{33}$ meter or a Piezotest PM300 Piezo meter. Thin films such as these with a 0.5 mm thickness may have a $d_{33}$ value after poling of about 1 pC/N to about 300 pC/N, or about 1 pC/N to about 100 pC/N, or about 2 pC/N to about 200 pC/N, or about 50 pC/N to about 150 pC/N, or about 75 pC/N to about 100 pC/N, or about 1 pC/N to about 10 pC/N, or about 10 pC/N to about 50 pC/N, or about 25 pC/N to about 200 pC/N, or about 50 pC/N to about 150 pC/N.

Cured parts have surprisingly high $d_{33}$ values following curing. In various embodiments, the difference between the $d_{33}$ values from the uncured parts to the cured parts is up to about a 100% increase, about a 100% increase to about a 200% increase, or about a 200% increase to about a 300% increase, or about a 100% increase to about a 300% increase.

Cured parts containing functionalized piezoelectric particles have surprisingly high $d_{33}$ values compared to those containing unfunctionalized piezoelectric particles. In various embodiments, the difference between the $d_{33}$ values from the uncured parts and the cured parts containing functionalized piezoelectric particles is up to about a 100% increase, about a 100% increase to about a 200% increase, or about a 50% increase to about a 200% increase.

The piezoelectric coefficient of a printed part may vary based on the treatments to the composition and the part. The printed parts or objects may be used in the automotive, aerospace, industrial manufacturing, and robotics industries. These printed parts can be used in sensors or transducers such as ultrasonic transducers. Since these piezoelectric compositions are printable and moldable, they can be placed in regions where traditional ceramic sensors and transducers cannot fit. They can be used for the detection of cracks, defects, delamination, ice accretion, or combinations thereof.

Embodiments disclosed herein include the following:

A. Compositions comprising piezoelectric particles. The compositions comprise: a plurality of piezoelectric particles dispersed in at least a portion of a polymer material comprising at least one thermoplastic polymer; and at least one thermal crosslinking agent dispersed in at least a portion of the polymer material; wherein the composition is melt processible at a melt processing temperature that is at or above a melting point or softening temperature of the at least one thermoplastic polymer for a melt processing time that retains at least a majority of the at least one thermal crosslinking in a non-crosslinked state.

B. Methods for forming a printed part via additive manufacturing. The methods comprise: providing the composition of A; depositing the composition layer-by-layer to form a printed part; and after depositing the composition layer-by-layer, heating the composition at a curing temperature that is at or above a minimum crosslinking temperature of the at least one thermal crosslinking agent for a time sufficient to crosslink or increase an extent of crosslinking of the at least one thermal crosslinking agent to form an at least partially cured printed part.

C. Printed parts having a latent crosslinking agent. The printed parts comprise: a plurality of piezoelectric particles dispersed in at least a portion of a polymer material comprising at least one thermoplastic polymer; and at least one thermal crosslinking agent dispersed in at least a portion of the polymer material; wherein at least a majority of the at least one thermal crosslinking is in a non-crosslinked state.

D. Thermally cured printed parts. The thermally cured printed parts comprise: a plurality of piezoelectric particles dispersed in at least a portion of a polymer material comprising at least one thermoplastic polymer; and at least one thermal crosslinking agent dispersed in a crosslinked state in at least a portion of the polymer material.

D1. Thermally cured parts comprising an arylacetylene crosslinker. The thermally cured parts comprise: a plurality of piezoelectric particles dispersed in at least a portion of a polymer material comprising at least one thermoplastic polymer; and at least one thermal crosslinking agent dispersed in a crosslinked state in at least a portion of the polymer material; wherein the at least one thermal crosslinking agent comprises a first thermal crosslinker comprising an arylacetylene having a reactive functional group and an optional second thermal crosslinker comprising a diarylacetylene; wherein the reactive functional group is reactive with a complementary functional group upon the piezoelectric particles, the polymer material, or any combination thereof.

Each of embodiments A, B, C, D, and D1 may include one or more of the following elements in any combination.

Element 1: wherein the at least one thermal crosslinking agent comprises a first thermal crosslinker comprising an arylacetylene having a reactive functional group, and an optional second thermal crosslinker comprising a diarylacetylene; wherein the reactive functional group is reactive with a complementary functional group upon the piezoelectric particles, the at least one thermoplastic polymer, or any combination thereof.

Element 2: wherein the first thermal crosslinker comprises an arylacetylene cyclic anhydride.

Element 3: wherein the polymer material comprises at least one amine-containing polymer, and at least a portion of the first thermal crosslinker is covalently bonded to an amine group of the at least one amine-containing polymer.

Element 4: wherein the at least one amine-containing polymer comprises at least one polyamide.

Element 5: wherein the piezoelectric particles comprise amine-functionalized piezoelectric particles, and at least a portion of the first thermal crosslinker is covalently bonded to an amine group of the amine-functionalized piezoelectric particles.

Element 6: wherein the second thermal crosslinker is present.

Element 7: wherein the first thermal crosslinker is covalently bonded to at least a portion of the polymer material, at least a portion of the piezoelectric particles, or any combination thereof.

Element 8: wherein the polymer material, the piezoelectric particles, and the at least one thermal crosslinking agent collectively define a form factor selected from the group consisting of a composite filament, a composite pellet, a composite powder, and a composite paste.

Element 9: wherein the piezoelectric particles comprise about 5 vol % to about 90 vol % of the composition based on total volume.

Element 10: wherein the polymer material, the piezoelectric particles, and the at least one thermal crosslinking agent collectively define a composite filament.

Element 11: wherein the piezoelectric particles are substantially non-agglomerated when combined with the polymer material.

Element 12: wherein the piezoelectric particles have an average particle size of about 100 microns or less.

Element 13: wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline, and any combination thereof.

Element 14: wherein the time is about 6 hours or greater, the curing temperature is about 200° C. or greater, or any combination thereof.

Element 15: wherein the process further comprises poling at least a portion of the at least partially cured printed part.

Element 16: wherein the polymer material and the piezoelectric particles collectively define a composite filament, and the printed part is formed by a fused filament fabrication process.

By way of non-limiting example, illustrative combinations applicable to A, B, C, D, and D1 include, but are not limited to, 1 and 2; 1-3; 1, 2, and 4; 1-4; 1-3 and 5; 1-5; 1, 2, and 6; 1-3 and 6; 1, 2, 4, and 6; 1-4 and 6; 1-3, 5, and 6; 1-6; 1, 2, and 8; 1, 2, and 9; 1, 2, and 10; 1, 2, and 11; 1, 2, and 12; 1, 2, and 13; 1, 2, and 14; 1, 2, and 15; 1-3 and 7; 1-3 and 8; 1-3 and 9; 1-3 and 10; 1-3 and 11; 1-3 and 12; 1-3 and 13; 1-3 and 14; 1-3 and 15; 1, 2, 4, and 7; 1, 2, 4, and 8; 1, 2, 4, and 9; 1, 2, 4, and 10; 1, 2, 4, and 11; 1, 2, 4, and 12; 1, 2, 4, and 13; 1, 2, 4, and 14; 1, 2, 4, and 15; 1-3, 5, and 7; 1-3, 5, and 8; 1-3, 5, and 9; 1-3, 5, and 10; 1-3, 5, and 11; 1-3, 5, and 12; 1-3, 5, and 13; 1-3, 5, and 14; 1-3, 5, and 15; 1-5 and 7; 1-5 and 8; 1-5 and 9; 1-5 and 10; 1-5 and 11; 1-5 and 12; 1-5 and 13; 1-5 and 14; 1-5 and 15; 1, 2, 6, and 7; 1, 2, 6, and 8; 1, 2, 6, and 9; 1, 2, 6, and 10; 1, 2, 6, and 11; 1, 2, 6, and 12; 1, 2, 6, and 13; 1, 2, 6, and 14; 1, 2, 6, and 15; 1-3, 6, and 7; 1-3, 6, and 8; 1-3, 6, and 9; 1-3, 6, and 10; 1-3, 6, and 11; 1-3, 6, and 12; 1-3, 6, and 13; 1-3, 6, and 14; 1-3, 6, and 15; 1, 2, 4, 6, and 7; 1, 2, 4, 6, and 8; 1, 2, 4, 6, and 9; 1, 2, 4, 6, and 10; 1, 2, 4, 6, and 11; 1, 2, 4, 6, and 12; 1, 2, 4, 6, and 13; 1, 2, 4, 6, and 14; 1, 2, 4, 6, and 15; 1-4, 6, and 7; 1-4, 6, and 8; 1-4, 6, and 9; 1-4, 6, and 10; 1-4, 6, and 11; 1-4, 6, and 12; 1-4, 6, and 13; 1-4, 6, and 14; 1-4, 6, and 15; 1-3 and 5-7; 1-3, 5, 6, and 8; 1-3, 5, 6, and 9; 1-3, 5, 6, and 10; 1-3, 5, 6, and 11; 1-3, 5, 6, and 12; 1-3, 5, 6, and 13; 1-3, 5, 6, and 14; 1-3, 5, 6, and 15; 1-7; 1-6 and 8; 1-6 and 9; 1-6 and 10; 1-6 and 11; 1-6 and 12; 1-6 and 13; 1-6 and 14; 1-6 and 15; 3 and 4; 3 and 5; 3-5; 3 and 6; 3, 4, and 6; 3, 5, and 6; 3-6; 3 and 7; 3 and 8; 3 and 9; 3 and 10; 3 and 11; 3 and 12; 3 and 13; 3 and 14; 3 and 15; 5 and 6; 5 and 7; 5 and 8; 5 and 9; 5 and 10; 5 and 11; 5 and 12; 5 and 13; 5 and 14; 5 and 15; 7 and 8; 7 and 9; 7 and 10; 7 and 11; 7 and 12; 7 and 13; 7 and 14; 7 and 15; 8 and 9; 8 and 10; 8 and 11; 8 and 12; 8 and 13; 8 and 14; 8 and 15; 9 and 10; 9 and 11; 9 and 12; 9 and 13; 9 and 14; 9 and 15; 10 and 11; 10 and 12; 10 and 13; 10 and 14; 10 and 15; 11 and 12; 11 and 13; 11 and 14; 11 and 15; 12 and 13; 12 and 14; 12 and 15; 13 and 14; 13 and 15; and 14 and 15.

Additional elements may include, but are not limited to:

Element 1: wherein the melt processing temperature is at or above a minimum crosslinking temperature of the at least one thermal crosslinking agent.

Element 2: wherein at least a portion of the at least one thermal crosslinking agent is a) covalently bonded to at least a portion of the polymer material, b) covalently bonded to at least a portion of the piezoelectric particles, or c) any combination thereof.

Element 3: wherein at least a portion of the at least one thermal crosslinking agent is not covalently bonded to the polymer material, the piezoelectric particles, or any combination thereof.

Element 4: wherein the at least one thermal crosslinking agent comprises a first thermal crosslinker comprising an arylacetylene having a reactive functional group, and an optional second thermal crosslinker comprising a diarylacetylene; wherein the reactive functional group is reactive with a complementary functional group upon the piezoelectric particles, the at least one thermoplastic polymer, or any combination thereof.

Element 5: wherein the first thermal crosslinker comprises an arylacetylene cyclic anhydride.

Element 6: wherein the polymer material comprises at least one amine-containing polymer, and at least a portion of the first thermal crosslinker is covalently bonded to an amine group of the at least one amine-containing polymer.

Element 7: wherein the at least one amine-containing polymer comprises at least one polyamide.

Element 8: wherein the piezoelectric particles comprise amine-functionalized piezoelectric particles, and at least a portion of the first thermal crosslinker is covalently bonded to an amine group of the amine-functionalized piezoelectric particles.

Element 9: wherein the second thermal crosslinker is present.

Element 10: wherein the first thermal crosslinker is covalently bonded to at least a portion of the polymer material, at least a portion of the piezoelectric particles, or any combination thereof Element 11: wherein the polymer material, the piezoelectric particles, and the at least one thermal crosslinking agent collectively define a composite filament.

Element 12: wherein the time is about 6 hours or greater, the curing temperature is about 200° C. or greater, or any combination thereof.

Element 13: wherein the method further comprises poling at least a portion of the at least partially cured printed part.

Element 14: wherein the polymer material, the piezoelectric particles, and the at least one thermal crosslinking agent collectively define a composite filament, and the printed part is formed by a fused filament fabrication process.

Additional exemplary combinations applicable to such additional elements include, but are not limited to: 1 and 4; 1, 4, and 5; 1, and 4-6; 1, and 4-7; 1 and 8; 4 and 5; 4-6; 4 and 7; 4 and 8; 4, 5, and 9; 4, and 9; 4-7; 4, 5, and 8; 4, 5, and 9; and 4, 5, and 10.

CLAUSES OF THE DISCLOSURE

The present disclosure is further directed to the following non-limiting embodiments:

Clause 1. A composition comprising:

a plurality of piezoelectric particles dispersed in at least a portion of a polymer material comprising at least one thermoplastic polymer; and at least one thermal crosslinking agent in a non-crosslinked state dispersed in at least a portion of the polymer material;

wherein the at least one thermal crosslinking agent in the non-crosslinked state is present in the polymer material a) in an unbound form, b) covalently bonded to at least a portion of the polymer material, c) covalently bonded to at least a portion of the piezoelectric particles, or d) any combination thereof; and wherein the polymer material, the piezoelectric particles, and the at least one thermal crosslinking agent collectively define a material that is thermally extrudable, moldable, or formable while maintaining the at least one thermal crosslinking agent in the non-crosslinked state.

Clause 2. The composition of clause 1, wherein the at least one thermal crosslinking agent comprises a first thermal crosslinker comprising an arylacetylene having a reactive functional group, and an optional second thermal crosslinker comprising a diarylacetylene;

wherein the reactive functional group is reactive with a complementary functional group upon the piezoelectric particles, the at least one thermoplastic polymer, or any combination thereof.

Clause 3. The composition of clause 2, wherein the first thermal crosslinker comprises an arylacetylene cyclic anhydride.

Clause 4. The composition of clause 3, wherein the polymer material comprises at least one amine-containing polymer, and at least a portion of the first thermal crosslinker is covalently bonded to an amine group of the at least one amine-containing polymer.

Clause 5. The composition of clause 4, wherein the at least one amine-containing polymer comprises at least one polyamide.

Clause 6. The composition of clause 3, wherein the piezoelectric particles comprise amine-functionalized piezoelectric particles, and at least a portion of the first thermal crosslinker is covalently bonded to an amine group of the amine-functionalized piezoelectric particles.

Clause 7. The composition of any one of clauses 2-6, wherein the second thermal crosslinker is present.

Clause 8. The composition of any one of clauses 2-7, wherein the first thermal crosslinker is covalently bonded to at least a portion of the polymer material, at least a portion of the piezoelectric particles, or any combination thereof.

Clause 9. The composition of any one of clauses 1-8, wherein the polymer material, the piezoelectric particles, and the at least one thermal crosslinking agent collectively define a form factor selected from the group consisting of a composite filament, a composite pellet, a composite powder, and a composite paste.

Clause 10. The composition of any one of clauses 1-9, wherein the piezoelectric particles comprise about 5 vol % to about 90 vol % of the composition based on total volume.

Clause 11. The composition of any one of clauses 1-10, wherein the polymer material, the piezoelectric particles, and the at least one thermal crosslinking agent collectively define a composite filament.

Clause 12. The composition of any one of clauses 1-11, wherein the piezoelectric particles are substantially non-agglomerated when combined with the polymer material.

Clause 13. The composition of any one of clauses 1-12, wherein the piezoelectric particles have an average particle size of about 100 microns or less.

Clause 14. The composition of any one of clauses 1-13, wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline, and any combination thereof.

Clause 15. An additive manufacturing process comprising:

providing the composition of any one of clauses 1-14;

depositing the composition layer-by-layer to form a printed part; and heating after depositing the composition layer-by-layer for a time sufficient to at least partially crosslink the at least one thermal crosslinking agent at a curing temperature sufficient to form an at least partially cured printed part.

Clause 16. The additive manufacturing process of clause 15, wherein the piezoelectric particles are substantially non-agglomerated when combined with the polymer material.

Clause 17. The additive manufacturing process of clause 15 or clause 16, wherein the piezoelectric particles have an average particle size of about 100 microns or less.

Clause 18. The additive manufacturing process of any one of clauses 15-17, wherein the time is about 6 hours or greater, the curing temperature is about 200° C. or greater, or any combination thereof.

Clause 19. The additive manufacturing process of any one of clauses 15-18, further comprising:

poling at least a portion of the at least partially cured printed part.

Clause 20. The additive manufacturing process of any one of clauses 15-19, wherein the polymer material and the piezoelectric particles collectively define a composite filament, and the printed part is formed by a fused filament fabrication process.

Clause 21. A printed part comprising the composition of any one of clauses 1-12.

Clause 22. A printed part comprising:

a plurality of piezoelectric particles dispersed in at least a portion of a polymer material comprising at least one thermoplastic polymer; and at least one thermal crosslinking agent dispersed in a crosslinked state in at least a portion of the polymer material;

wherein the at least one thermal crosslinking agent comprises a first thermal crosslinker comprising an arylacetylene having a reactive functional group and an optional second thermal crosslinker comprising a diarylacetylene;

wherein the reactive functional group is reactive with a complementary functional group upon the piezoelectric particles, the polymer material, or any combination thereof.

Clause 23. The printed part of clause 22, wherein the second thermal crosslinker is present.

The present disclosure is further directed to the following additional non-limiting embodiments:

Clause 1. A composition comprising:

a plurality of piezoelectric particles dispersed in at least a portion of a polymer material comprising at least one thermoplastic polymer; and at least one thermal crosslinking agent dispersed in at least a portion of the polymer material;

wherein the composition is melt processible at a melt processing temperature that is at or above a melting point or softening temperature of the at least one thermoplastic polymer for a melt processing time that retains at least a majority of the at least one thermal crosslinking in a non-crosslinked state.

Clause 2. The composition of clause 1, wherein the melt processing temperature is at or above a minimum crosslinking temperature of the at least one thermal crosslinking agent.

Clause 3. The composition of clause 1 or clause 2, wherein at least a portion of the at least one thermal crosslinking agent is a) covalently bonded to at least a portion of the polymer material, b) covalently bonded to at least a portion of the piezoelectric particles, or c) any combination thereof.

Clause 4. The composition of any one of clauses 1-3, wherein at least a portion of the at least one thermal crosslinking agent is not covalently bonded to the polymer material, the piezoelectric particles, or any combination thereof.

Clause 5. The composition of any one of clauses 1-4, wherein the at least one thermal crosslinking agent comprises a first thermal crosslinker comprising an arylacetylene having a reactive functional group, and an optional second thermal crosslinker comprising a diarylacetylene;

wherein the reactive functional group is reactive with a complementary functional group upon the piezoelectric particles, the at least one thermoplastic polymer, or any combination thereof.

Clause 6. The composition of clause 5, wherein the first thermal crosslinker comprises an arylacetylene cyclic anhydride.

Clause 7. The composition of any one of clauses 1-6, wherein the polymer material comprises at least one amine-containing polymer, and at least a portion of the first thermal crosslinker is covalently bonded to an amine group of the at least one amine-containing polymer.

Clause 8. The composition of clause 7, wherein the at least one amine-containing polymer comprises at least one polyamide.

Clause 9. The composition of any one of clauses 1-8, wherein the piezoelectric particles comprise amine-functionalized piezoelectric particles, and at least a portion of the first thermal crosslinker is covalently bonded to an amine group of the amine-functionalized piezoelectric particles.

Clause 10. The composition of any one of clauses 5-9, wherein the second thermal crosslinker is present.

Clause 11. The composition of any one of clauses 5-10, wherein the first thermal crosslinker is covalently bonded to at least a portion of the polymer material, at least a portion of the piezoelectric particles, or any combination thereof.

Clause 12. The composition of any one of clauses 1-11, wherein the polymer material, the piezoelectric particles, and the at least one thermal crosslinking agent collectively define a composite filament.

Clause 13. An additive manufacturing process comprising:

providing the composition of any one of clauses 1-12;

depositing the composition layer-by-layer to form a printed part; and after depositing the composition layer-by-layer, heating the composition at a curing temperature that is at or above a minimum crosslinking temperature of the at least one thermal crosslinking agent for a time sufficient to crosslink or increase an extent of crosslinking of the at least one thermal crosslinking agent to form an at least partially cured printed part.

Clause 14. The additive manufacturing process of clause 13, wherein the time is about 6 hours or greater, the curing temperature is about 200° C. or greater, or any combination thereof.

Clause 15. The additive manufacturing process of clause 13 or clause 14, wherein the at least one thermal crosslinking agent comprises a first thermal crosslinker comprising an arylacetylene having a reactive functional group, and a second thermal crosslinker comprising a diarylacetylene;

wherein the reactive functional group is reactive with a complementary functional group upon the piezoelectric particles, the at least one thermoplastic polymer, or any combination thereof.

Clause 16. The additive manufacturing process of clause 15, wherein at least a portion of the first thermal crosslinker is covalently bonded to at least a portion of the polymer material, at least a portion of the piezoelectric particles, or any combination thereof.

Clause 17. The additive manufacturing process of any one of clauses 13-16, further comprising:

poling at least a portion of the at least partially cured printed part.

Clause 18. The additive manufacturing process of any one of clauses 13-17, wherein the polymer material, the piezoelectric particles, and the at least one thermal crosslinking agent collectively define a composite filament, and the printed part is formed by a fused filament fabrication process.

Clause 19. A printed part comprising the composition of any one of clauses 1-12, wherein the composition is printed at or above the melting processing temperature of the at least one thermoplastic polymer.

Clause 20. A printed part comprising:

a plurality of piezoelectric particles dispersed in at least a portion of a polymer material comprising at least one thermoplastic polymer; and at least one thermal crosslinking agent dispersed in a crosslinked state in at least a portion of the polymer material;

wherein the at least one thermal crosslinking agent comprises a first thermal crosslinker comprising an arylacetylene having a reactive functional group and a second thermal crosslinker comprising a diarylacetylene;

wherein the reactive functional group is reactive with a complementary functional group upon the piezoelectric particles, the polymer material, or any combination thereof.

To facilitate a better understanding of the present disclosure, the following examples of preferred or representative embodiments are given. In no way should the following examples be read to limit, or to define, the scope of the invention.

EXAMPLES

Materials. Nylon 6 was obtained from Sigma-Aldrich and had a melting point of 228.5° C. and a Tg of 62.5° C. ELVAMIDE (PA6/66/610 copolymer) was obtained from DuPont and had a melting point of 156° C. Both polymers were dried at 80° C. overnight under vacuum prior to melt processing. NEXAMITE A32 (Structure 1) and NEXAMITE A33 (Structure 2) arylacetylene crosslinkers were obtained from Nexam Chemical and used as received.

Structure 1

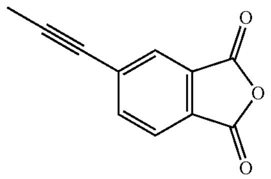

-continued

Structure 2

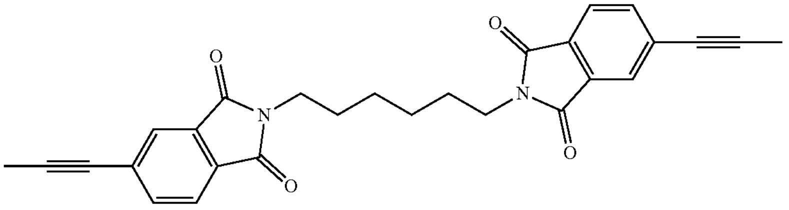

Example A: De-Agglomeration of PZT. Lead Zirconate Titanate (PZT, APC International, Ltd.) was added to a mixture of 450 mL isopropanol and 50 mL deionized water in a 1000 mL beaker with a magnetic stir bar. The mixture was sonicated with a probe sonicator (Branson Digital Probe Sonifier 450) under magnetic stirring for 30 minutes at 25% amplitude. The initial PZT agglomerates were decreased to a primary particle size of 1-2 μm following sonication. The de-agglomerated PZT particles were isolated by centrifugation, washed twice with isopropanol, and dried at 80° C. under vacuum overnight. Alternately, de-agglomeration may be accomplished by high-shear homogenization of a suspension of 250 g PZT agglomerates in 250 g water for 30 minutes, followed by isolation and drying as above.

Example B: Amine-Functionalization of PZT particles (PZT-$NH_2$). The mixture from Example A was produced as above, except 50 g of PZT agglomerates were sonicated for 45 minutes in pulse mode (1 s on/0.5 s off) at 50% amplitude. The resulting mixture was transferred, without isolating the PZT particles, to a 1000 mL round bottom flask, and 25 g of (3-aminopropyl)triethoxysilane (APTES) was added to the round bottom flask, followed by stirring of the reaction mixture overnight at room temperature. The reaction mixture was then heated at 80° C. for 3 h using an oil bath under magnetic stirring. After 3 h, the reaction mixture was cooled to room temperature and centrifuged (3000 rpm, 30 min) to isolate amine-functionalized PZT particles. The amine-functionalized PZT particles were washed with isopropanol and centrifuged, followed by a second cycle of washing and centrifugation. Thereafter, the amine-functionalized PZT particles (PZT-$NH_2$) were dried at 60° C. under vacuum overnight. The degree of surface modification as determined by elemental composition and TGA analyses included 16.9 mmol (3.8 wt %) of covalently bonded aminosilane per 100 g PZT.

Comparative Example 1: 40 vol % PZT in Nylon 6. 32.5 g of Nylon 6 pellets were added to a Haake Rheomix 600 set at 240° C. After the Nylon 6 pellets had melted, 153.4 g of de-agglomerated PZT particles were slowly added to the polymer melt, followed by melt mixing for 10 min. The maximum temperature reached was 253° C. The mixture was discharged onto an aluminum pan and allowed to cool to ambient temperature. The resulting composite was shredded (SHR3D IT, 3devo) for further processing.

Comparative Example 2: 50 vol % PZT in Nylon 6. Comparative Example 2 was performed in the manner of Comparative Example 1, with the exceptions that the amount of Nylon 6 was 27.1 g, the amount of de-agglomerated PZT particles was 191.7 g, the set temperature of the Haake mixer was 230° C., and the maximum temperature reached was 237° C.

Comparative Example 3: 40 vol % PZT in ELVAMIDE 8064. Comparative Example 3 was performed in the manner of Comparative Example 1, with the exceptions that ELVAMIDE 8064 was used instead of Nylon 6 and in an amount of 32.4 g, the set temperature of the Haake mixer was 200° C., and the maximum temperature reached was 217° C.

Comparative Example 4: 50 vol % PZT in ELVAMIDE 8064. Comparative Example 4 was performed in the manner of Comparative Example 3, with the exceptions that ELVAMIDE 8064 was used in an amount of 27.0 g, the amount of de-agglomerated PZT particles was 191.7 g, and the maximum temperature reached was 211° C.

Example 1: 50 vol % PZT in Nylon 6:NEXAMITE A32/A33 (2:4). 27.1 g of Nylon 6 pellets, 0.54 g NEXAMITE A32 (2 wt % with respect to Nylon 6), and 1.08 g NEXAMITE A33 (4 wt % with respect to Nylon 6) were added to a Haake Rheomix 600 set at 225° C. After the Nylon 6 pellets had melted and become blended with the NEXAMITE A32/A33, 191.7 g of de-agglomerated PZT particles were slowly added to the polymer melt, followed by melt mixing for 10 min. The maximum temperature reached was 234° C. The mixture was discharged onto an aluminum pan and allowed to cool to ambient temperature. The resulting composite was shredded (SHR3D IT, 3devo) for further processing.

Example 2: 50 vol % PZT-$NH_2$ in Nylon 6:NEXAMITE A32/A33 (2:4). Example 2 was performed in the manner of Example 1, with the exceptions that amine-modified PZT particles (PZT-$NH_2$) were used instead of unfunctionalized, de-agglomerated PZT particles, and the maximum temperature reached was 234° C.

Example 3: 50 vol % PZT-$NH_2$ in Nylon 6:NEXAMITE A32/A33 (2:4):Graphene. Example 3 was performed in the manner of Example 2, with the exceptions that 24.4 g Nylon 6 and 2.7 g Nylon 6 composite (containing 1 vol % graphene nanoplatelets) were used instead of only Nylon 6 pellets, and the maximum temperature reached was 236° C.

Example 4: 50 vol % PZT-$NH_2$ in 2:1 Nylon 6:ELVAMIDE 8064: NEXAMITE A32/A33 (2:4). Example 4 was performed in the manner of Example 2, with the exceptions that 18.0 g Nylon 6 and 9.0 g ELVAMIDE 8064 pellets were used instead of only Nylon 6 pellets, and the maximum temperature reached was 239° C.

Example 5: 50 vol % PZT-$NH_2$ in 2:1 Nylon 6:ELVAMIDE 8064: NEXAMITE A32/A33 (2:4):Graphene. Example 5 was performed in the manner of Example 2, with the exceptions that 15.0 g Nylon 6, 3.0 g Nylon 6 composite (containing 1 vol % graphene nanoplatelets), and 9.0 g ELVAMIDE 8064 pellets were used instead of only Nylon 6 pellets, and the maximum temperature reached was 242° C.

Example 6: 50 vol % PZT in ELVAMIDE 8064:NEXAMITE A32/A33 (2:4). Example 6 was performed in the manner of Example 1, with the exception that 27.0 g ELVAMIDE 8064 pellets were used instead of Nylon 6 pellets. The set temperature of the Haake mixer was 200° C., and the maximum temperature reached was 216° C.

Example 7: 50 vol % PZT-$NH_2$ in ELVAMIDE 8064: NEXAMITE A32/A33 (2:4):Carbon Nanofibers. Example 7 was performed in the manner of Example 6, with the exception that 1.0 g of carbon nanofibers were added to the polymer melt before adding the NEXAMITE A32/A33. The set temperature of the Haake mixer was 200° C., and the maximum temperature reached was 216° C.

Example 8: 50 vol % PZT-$NH_2$ in ELVAMIDE 8064: NEXAMITE A32/A33 (2:8). Example 8 was performed in the manner of Example 6, with the exception that 2.16 g of NEXAMITE A33 was used to give a loading of 8 wt % with respect to the polymer. The set temperature of the Haake mixer was 200° C., and the maximum temperature reached was 212° C.

Composite Filament Extrusion Conditions. The composites prepared as above were processed into filaments using a Filabot EX6 filament extruder. The apparatus consists of an extruder, an air path, and a filament winder. The extruder had four zones of heating: i) a feed port, ii) a back zone, iii) a middle zone, and iv) a front zone. The extrusion speed was controlled by adjusting the voltage. The apparatus was modified to provide a digital readout of the set voltage and current for controlling the motor for the single screw and therefore the extrusion speed. The design of the extrusion screw can be varied. The nozzle can be interchanged with nozzles of different diameters. The air path can be adjusted for airflow through changing the distance from the outlet nozzle or by raising the air path on a jack. The airflow was kept at 100% for all filaments prepared herein, and the height of the air path was kept constant. The distance of the air path from the nozzle outlet during the filament preparation was regulated to maintain a constant filament diameter. Table 1 summarizes the conditions used to prepare selected composite filaments.

TABLE 1

| | Composite Filaments | | | | |
|---|---|---|---|---|---|
| | Comparative Example 1 | Comparative Example 3 | Comparative Example 4 | Example 6 | Example 7 |
| Feed Temperature (° C.) | 50 | | 40 | | |
| Back Temperature (° C.) | 220 | | 180 | | |
| Middle Temperature (° C.) | 240 | | 200 | | |
| Front Temperature (° C.) | 240 | | 200 | | |
| Voltage (V) | 18 | 20 | 25 | 24 | 27 |
| Nozzle size (mm) | | | 175 | | |
| Winding speed (rpm) | | | 0.7-1.0 | | |
| Air flow (%) | | | 100 | | |
| Average filament diameter (mm) | 1.45 | 1.75 | 1.60 | 1.64 | 1.60 |

Alternative Composite Filament Preparation. Many samples containing Nylon 6 were quite viscous due to favorable interactions of the polymer with the PZT and the high loadings of PZT in the polymer. Processing of these composites favored higher torque, and better temperature and flow control than the Filabot EX6 is capable of providing to create uniform composite filaments. For composites unable to be effectively extruded with the Filabot EX6 apparatus, filament sections of about 20 cm in length were prepared by heat pressing the composites in molds using a Carver 3891 Auto MH-PL heat press. The press temperature was set at 245° C. and 5 tons of force was applied.

Piezoelectric Properties. Samples for piezoelectric testing were prepared either by thermopressing or by 3-D printing a composite filament, followed by poling of the samples.

Thermopressed samples were prepared using a Carver 3891 Auto MH-PL heat press by heating the samples to 245° C. for composites containing Nylon 6 and 200° C. for composites containing ELVAMIDE 8065 using an applied force of 5 tons and appropriate molds. The thermopressed samples were approximately 2×2 cm with thicknesses ranging from 0.1 to 1.0 mm.

3-D printing was conducted using a Hyrel Hydra 16A 3D printer. Single and multiple layered structures were printed in the form of squares or discs. Samples containing Nylon 6 were printed on LAYERLOCK GAROLITE with PVA, on glass with MAGIGOO PA adhesive, or on cured conductive silver ink (DuPont 5025) with plain carbon fiber-reinforced plastic (CFRP). Print conditions for Nylon 6 were the following: nozzle diameter=0.50 mm, hot end extrusion nozzle temperature=270° C., bed temperature=100° C., speed of nozzle head=20 mm/s, infill=100%, and single layer height=0.2 mm. Samples containing only ELVAMIDE 8064 were printed directly onto aluminum with an epoxy or urethane adhesive layer on CFRP plaques with a cured layer of conductive silver ink (DuPont 5025). Print conditions for ELVAMIDE 8064 were the following: nozzle diameter=0.50 mm, hot end extrusion nozzle temperature=200° C., bed temperature=100° C., speed of nozzle head=20 mm/s, infill=100%, and single layer height=0.2 mm. Printing of mixtures of both polymers at a bed temperature of 200° C. allowed for sufficient substrate adhesion to occur without the need for an additional adhesion layer.

Thermal curing of samples containing NEXAMITE A32/A33 was carried out prior to poling and measurement of piezoelectric properties. Curing of samples containing Nylon 6 was carried out at 210° C. for at least 24 h. Samples containing only ELVAMIDE 8064 were heat cured at 200° C. for at least 24 h. Piezoelectric properties were measured both before and after curing, following appropriate poling.

Prior to measuring piezoelectric properties, the samples were poled using a corona poling method. Prior to poling, a thin top electrode was applied to one side of the printed or thermopressed composite sample. This action was performed by either i) sputter coating (gold/palladium/aluminum) or ii) coating the surface with a thin layer (about 0.2 μm) of Ag/epoxy conductive paste (MG Chemicals 8330D) and allowing the paste to cure at room temperature for 1 h. The samples were all corona poled under similar conditions: 6-8 kV applied to a scorotron wire at a distance of 1 mm from the sample for 30 min at 80-90° C. Poling conditions were not optimized for each sample. Poling could also be performed using the contact poling method, optionally in a high dielectric medium. Poling can also be improved in some cases by repeating the poling process. For uncured samples, poling was conducted, and the piezoelectric properties were measured without curing taking place. For cured samples, the samples were only poled after curing.

Piezoelectric properties were evaluated by measuring the $d_{33}$ value using an APC International Wide-Range $d_{33}$ meter or a Piezotest PM300 Piezo meter. The $d_{33}$ value measures the induced polarization in direction 3 (parallel to the direction in which polarization occurs) per unit stress applied in direction 3. The $d_{33}$ meter is capable of measuring $d_{33}$ values between 1-2000 pC/N at an operating frequency of 110 Hz and an amplitude of 0.25 N.

Table 2 summarizes averaged $d_{33}$ measurements of various samples, both before and after curing (when performed). Sample variation at various measurement locations may be caused by defects in the samples as a result of the printing process or possibly by differences in the corona poling process. Variability in the thickness of samples may also contribute to the relatively wide error in some cases.

TABLE 2

| Example | Thickness (μm) | Curing Temperature (° C.) and time (h) | Thermopressed Samples $d_{33}$ (pC/N) | 3D-Printed Samples $d_{33}$ (pC/N) |
|---|---|---|---|---|
| Comparative Example 1 | 300 | — | 10.5 ± 0.6 | — |
| Comparative Example 1 | 400 | — | — | 4.7 ± 0.4 |
| Comparative Example 2 | 300 | — | 22.5 ± 1.3 | — |
| Comparative Example 3 | 400 | — | 6.9 ± 2.7 | 6.2 ± 0.5 |
| Comparative Example 4 | 500 | — | 15.6 ± 4.2 | — |
| Comparative Example 4 | 400 | — | — | 26.5 ± 11.4 |
| Example 1 | 450 | — | 24.9 ± 8.0 | — |
| | | 210/24 | 42.7 ± 10.1 | — |
| Example 2 | 450 | — | 29.9 ± 18.0 | 18.2 ± 1.6 |
| | | 210/24 | 87.3 ± 33.2 | 44.0 ± 11.0 |
| Example 3 | 450 | — | 33.1 ± 14.4 | — |
| | | 210/24 | 92.9 ± 21.7 | — |
| Example 4 | 550 | — | 28.9 ± 3.9 | — |
| | | 210/24 | 83.2 ± 47.0 | — |
| Example 5 | 500 | — | 45.0 ± 16.0 | — |
| | | 210/24 | 91.9 ± 34.0 | — |
| Example 6 | 400 | — | 11.6 ± 1.9 | 23.8 ± 3.8 |
| | | 200/24 | 30.1 ± 9.2 | 35.0 ± 9.8 |
| Example 7 | 400 | — | 14.0 ± 1.4 | 38.0 ± 22.3 |
| | | 200/24 | 47.6 ± 7.9 | 62.7 ± 8.7 |
| Example 8 | 500 | — | 17.4 ± 5.4 | — |
| | | 200/24 | 46.6 ± 8.6 | — |

Comparable samples with and without NEXAMITE did not exhibit significant differences in their $d_{33}$ values prior to curing (e.g., comparing Example 1 against Comparative Example 2 and Example 6 against Comparative Example 4). Following curing of the samples containing NEXAMITE, a significant increase in $d_{33}$ values occurred for all samples. The increase was two- to four-fold in most cases. Amine-functionalization of the piezoelectric particles afforded a further increase in $d_{33}$ following curing in comparable samples (e.g., comparing Example 1 against Example 2), whereas the $d_{33}$ values were comparable prior to curing.

The $d_{33}$ values of composites containing ELVAMIDE tended to be lower than corresponding composites containing Nylon 6, likely because Nylon 6 has higher polarity and experiences better interaction with the PZT particles than does ELVAMIDE. ELVAMIDE, however, has a lower processing temperature and a lower rate of crystallization than does Nylon 6, which lends itself to easier processing and printing, and potentially better adhesion at lower processing temperatures.

Figure 2:
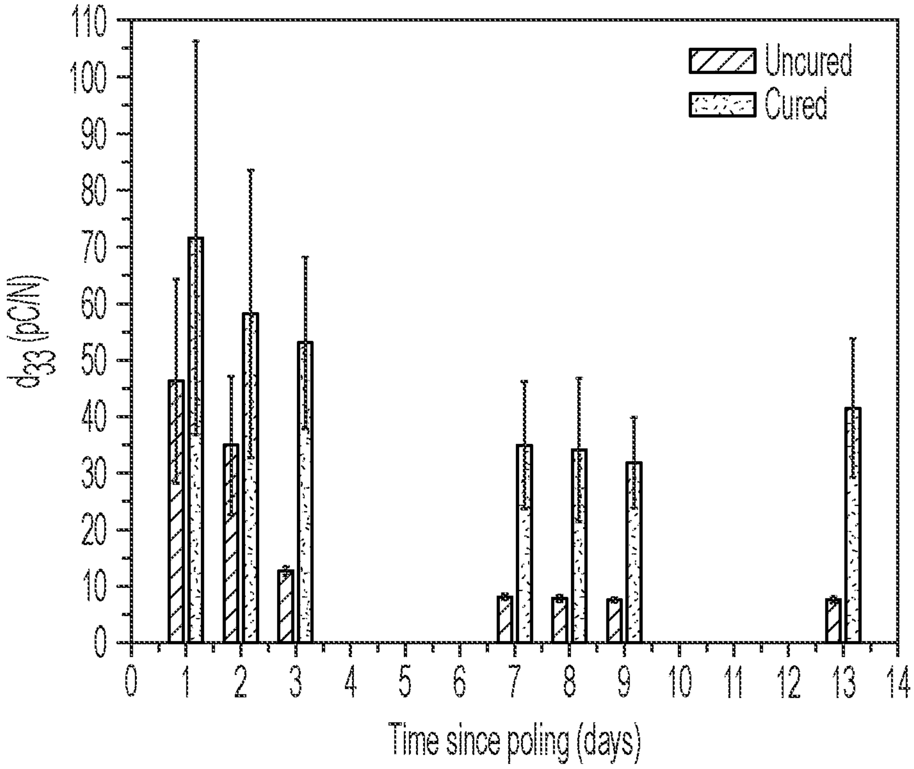
FIG. 2 is a bar graph of the change in $d_{33}$ value over time of an uncured and a cured piezoelectric composite.

Cured piezoelectric composites tended to experience a lower loss in $d_{33}$ value upon exposure to moisture than did the corresponding uncured piezoelectric composites. FIG. 2 is a bar graph of the change in $d_{33}$ value over time of uncured and cured piezoelectric composites produced using the composite of Example 2. As shown, the uncured sample experienced a large drop in $d_{33}$ over time, whereas the cured sample did not. Not being bound by theory, the results associated with the uncured sample may be due to absorption of water by the polymer material, thereby lowering the $T_g$ and removing alignment of the poles of the piezoelectric particles. Again not being bound by theory, crosslinking of the piezoelectric particles and the polymer matrix is believed to prevent moisture absorption by the polymer material and stabilize the relative positions of the piezoelectric particles in the polymer material. Of further note, the initial $d_{33}$ shown in FIG. 2 differs somewhat from that reported in Table 2 for the corresponding sample. The difference in the initial $d_{33}$ value may be associated with variability in forming the samples, variability in the poling conditions and environmental factors, age of the sample, time since poling was completed, and the like.

Mechanical Properties. Various mechanical properties of the piezoelectric composites were evaluated under standard testing conditions. Table 3 below compares the mechanical properties of uncured and cured piezoelectric composites of Example 8.

TABLE 3

| | Young's Modulus (GPa) | Tensile Strength at Break (MPa) | Elongation at Yield (%) | Elongation at Break (%) |
|---|---|---|---|---|
| Uncured | 2.19 ± 0.37 | 16.3 ± 0.5 | — | 1.8 ± 0.2 |
| Cured | 2.48 ± 0.45 | 21.0 ± 1.5 | 0.5 ± 0.1 | 2.0 ± 0.1 |

The improved mechanical properties, particularly the increase in Young's Modulus, are attributed to crosslinking of the polymer matrix with itself and the piezoelectric particles. The tensile tests were performed at 5 mm/min using an Instron Universal Testing Machine Model 3367 (ASTM D638-16). A 2 kN load cell with 2 kN side-action groups were used. Bluehill Universal software version 4.13.25772 was used for data processing.

All documents described herein are incorporated by reference herein for purposes of all jurisdictions where such practice is allowed, including any priority documents and/or testing procedures to the extent they are not inconsistent with this text. As is apparent from the foregoing general description and the specific embodiments, while forms of the disclosure have been illustrated and described, various modifications can be made without departing from the spirit and scope of the disclosure. Accordingly, it is not intended that the disclosure be limited thereby. For example, the compositions described herein may be free of any component, or composition not expressly recited or disclosed herein. Any method may lack any step not recited or disclosed herein. Likewise, the term "comprising" is considered synonymous with the term "including." Whenever a method, composition, element, or group of elements is preceded with the transitional phrase "comprising," it is understood that we also contemplate the same composition or group of elements with transitional phrases "consisting essentially of," "consisting of," "selected from the group consisting of," or "is" preceding the recitation of the composition, element, or elements and vice versa.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

One or more illustrative embodiments are presented herein. Not all features of a physical implementation are described or shown in this application for the sake of clarity. It is understood that in the development of a physical embodiment of the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for one of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to one having ordinary skill in the art and having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein.

What is claimed is the following:

1. A composition comprising:

a plurality of piezoelectric particles dispersed in at least a portion of a polymer material comprising at least one thermoplastic polymer; and at least one thermal crosslinking agent dispersed in at least a portion of the polymer material;

wherein the composition is melt processible at a melt processing temperature that is at or above a melting point or softening temperature of the at least one thermoplastic polymer for a melt processing time that retains at least a majority of the at least one thermal crosslinking in a non-crosslinked state.

2. The composition of claim 1, wherein the melt processing temperature is at or above a minimum crosslinking temperature of the at least one thermal crosslinking agent.

3. The composition of claim 1, wherein at least a portion of the at least one thermal crosslinking agent is a) covalently bonded to at least a portion of the polymer material, b) covalently bonded to at least a portion of the piezoelectric particles, or c) any combination thereof.

4. The composition of claim 1, wherein at least a portion of the at least one thermal crosslinking agent is not covalently bonded to the polymer material, the piezoelectric particles, or any combination thereof.

5. The composition of claim 1, wherein the at least one thermal crosslinking agent comprises a first thermal crosslinker comprising an arylacetylene having a reactive functional group, and an optional second thermal crosslinker comprising a diarylacetylene;

wherein the reactive functional group is reactive with a complementary functional group upon the piezoelectric particles, the at least one thermoplastic polymer, or any combination thereof.

6. The composition of claim 5, wherein the first thermal crosslinker comprises an arylacetylene cyclic anhydride.

7. The composition of claim 6, wherein the polymer material comprises at least one amine-containing polymer, and at least a portion of the first thermal crosslinker is covalently bonded to an amine group of the at least one amine-containing polymer.

8. The composition of claim 7, wherein the at least one amine-containing polymer comprises at least one polyamide.

9. The composition of claim 6, wherein the piezoelectric particles comprise amine-functionalized piezoelectric particles, and at least a portion of the first thermal crosslinker is covalently bonded to an amine group of the amine-functionalized piezoelectric particles.

10. The composition of claim 5, wherein the second thermal crosslinker is present.

11. The composition of claim 5, wherein the first thermal crosslinker is covalently bonded to at least a portion of the polymer material, at least a portion of the piezoelectric particles, or any combination thereof.

12. The composition of claim 1, wherein the polymer material, the piezoelectric particles, and the at least one thermal crosslinking agent collectively define a composite filament.

13. An additive manufacturing process comprising:

providing the composition of claim 1;

depositing the composition layer-by-layer to form a printed part; and after depositing the composition layer-by-layer, heating the composition at a curing temperature that is at or above a minimum crosslinking temperature of the at least one thermal crosslinking agent for a time sufficient to crosslink or increase an extent of crosslinking of the at least one thermal crosslinking agent to form an at least partially cured printed part.

14. The additive manufacturing process of claim 13, wherein the time is about 6 hours or greater, the curing temperature is about 200° C. or greater, or any combination thereof.

15. The additive manufacturing process of claim 13, wherein the at least one thermal crosslinking agent comprises a first thermal crosslinker comprising an arylacetylene having a reactive functional group, and a second thermal crosslinker comprising a diarylacetylene;

wherein the reactive functional group is reactive with a complementary functional group upon the piezoelectric particles, the at least one thermoplastic polymer, or any combination thereof.

16. The additive manufacturing process of claim 15, wherein at least a portion of the first thermal crosslinker is covalently bonded to at least a portion of the polymer material, at least a portion of the piezoelectric particles, or any combination thereof.

17. The additive manufacturing process of claim 13, further comprising:

poling at least a portion of the at least partially cured printed part.

18. The additive manufacturing process of claim 13, wherein the polymer material, the piezoelectric particles, and the at least one thermal crosslinking agent collectively define a composite filament, and the printed part is formed by a fused filament fabrication process.

19. A printed part comprising the composition of claim 1, wherein the composition is printed at or above the melting processing temperature of the at least one thermoplastic polymer.

20. A printed part comprising:

a plurality of piezoelectric particles dispersed in at least a portion of a polymer material comprising at least one thermoplastic polymer; and at least one thermal crosslinking agent dispersed in a crosslinked state in at least a portion of the polymer material;

wherein the at least one thermal crosslinking agent comprises a first thermal crosslinker comprising an arylacetylene having a reactive functional group and a second thermal crosslinker comprising a diarylacetylene;

wherein the reactive functional group is reactive with a complementary functional group upon the piezoelectric particles, the polymer material, or any combination thereof.

* * * * *